United States Patent
Silverbrook

(10) Patent No.: US 7,287,834 B2
(45) Date of Patent: *Oct. 30, 2007

(54) MICRO-ELECTROMECHANICAL INK EJECTION DEVICE WITH AN ELONGATE ACTUATOR

(75) Inventor: Kia Silverbrook, Balmain (AU)

(73) Assignee: Silverbrook Research Pty Ltd, Balmain, New South Wales (AU)

( * ) Notice: Subject to any disclaimer, the term of this patent is extended or adjusted under 35 U.S.C. 154(b) by 0 days.

This patent is subject to a terminal disclaimer.

(21) Appl. No.: 11/520,569

(22) Filed: Sep. 14, 2006

(65) Prior Publication Data

US 2007/0008373 A1   Jan. 11, 2007

Related U.S. Application Data

(63) Continuation of application No. 10/933,286, filed on Sep. 3, 2004, now Pat. No. 7,125,102, which is a continuation of application No. 10/728,920, filed on Dec. 8, 2003, now Pat. No. 6,786,574, which is a continuation of application No. 10/309,080, filed on Dec. 4, 2002, now Pat. No. 6,682,176, which is a continuation-in-part of application No. 09/113,122, filed on Jul. 10, 1998, now Pat. No. 6,557,977.

(30) Foreign Application Priority Data

Jul. 15, 1997 (AU) .................................. PO7991
Jul. 15, 1997 (AU) .................................. PO8004

(51) Int. Cl.
*B41J 2/04* (2006.01)
*B41J 2/05* (2006.01)

(52) U.S. Cl. ........................................ 347/54; 347/65

(58) Field of Classification Search ................. 347/54, 347/65
See application file for complete search history.

(56) References Cited

U.S. PATENT DOCUMENTS

| | | | |
|---|---|---|---|
| 4,032,929 A | 6/1977 | Fischbeck et al. | |
| 4,210,920 A | 7/1980 | Burnett et al. | |
| 4,460,905 A | 7/1984 | Thomas | |

(Continued)

FOREIGN PATENT DOCUMENTS

DE          3245283 A     6/1984

(Continued)

*Primary Examiner*—An H. Do

(57) ABSTRACT

A micro-electromechanical ink ejection device for a printer includes a wafer substrate defining an ink inlet channel and incorporating drive circuitry. A nozzle chamber structure is positioned on the wafer substrate and includes a wall that defines a slot extending away from the substrate and a roof that defines a part-circumferential opening into the slot, the nozzle chamber structure defining a nozzle chamber in fluid communication with the ink inlet channel and an ink ejection port through which ink in the nozzle chamber can be ejected. An ink ejection paddle is positioned in the nozzle chamber and is displaceable towards and away from the ink ejection port to eject ink from the ink ejection port. A support extends from the wafer substrate outside the nozzle chamber. An elongate actuator extends from the support and is connected to the drive circuitry to be displaceable on receipt of a signal from the drive circuitry. The actuator is connected to the paddle and is shaped to correspond with the slot and the part circumferential opening.

7 Claims, 42 Drawing Sheets

U.S. PATENT DOCUMENTS

| | | |
|---|---|---|
| 4,576,111 A | 3/1986 | Slomianny |
| 4,633,267 A | 12/1986 | Meinhof |
| 4,723,131 A | 2/1988 | Droit |
| 4,737,802 A | 4/1988 | Mielke |
| 5,255,016 A | 10/1993 | Usui et al. |
| 5,719,604 A * | 2/1998 | Inui et al. ............ 347/54 |
| 5,788,468 A | 8/1998 | Dewa et al. |
| 5,812,159 A | 9/1998 | Anagnostopoulos et al. |
| 5,903,380 A | 5/1999 | Motamedi et al. |
| 5,982,521 A | 11/1999 | Bessho et al. |
| 6,174,050 B1 | 1/2001 | Kashino et al. |
| 6,561,627 B2 | 5/2003 | Jarrold et al. |
| 6,588,884 B1 | 7/2003 | Furlani et al. |
| 6,598,960 B1 | 7/2003 | Cabal et al. |
| 6,631,979 B2 | 10/2003 | Lebens et al. |
| 6,832,828 B2 | 12/2004 | Silverbrook |
| 7,077,507 B2 * | 7/2006 | Silverbrook ............ 347/54 |

FOREIGN PATENT DOCUMENTS

| | | |
|---|---|---|
| DE | 4139731 | 6/1993 |
| EP | 0189794 A | 8/1986 |
| EP | 371763 A2 | 6/1990 |
| EP | 0371763 A2 | 6/1990 |
| EP | 0417673 A | 3/1991 |
| EP | 0479441 A | 4/1992 |
| EP | 0634273 A2 | 1/1995 |
| EP | 0671271 A | 9/1995 |
| GB | 2262152 | 6/1993 |
| GB | 1569425 A | 12/1997 |
| JP | 55059972 A | 7/1980 |
| JP | 359093356 A | 5/1984 |
| JP | 60131254 A | 7/1985 |
| JP | 03-202351 A | 12/1989 |
| JP | 02-034342 A | 2/1990 |
| JP | 2150353 A | 6/1990 |
| JP | 02-219655 A | 9/1990 |
| JP | 2265751 A | 10/1990 |
| JP | 2265752 A | 10/1990 |
| JP | 02-273241 A | 11/1990 |
| JP | 03-065349 A | 3/1991 |
| JP | 04-126255 A | 4/1992 |
| JP | 04-129745 A | 4/1992 |
| JP | 04-357039 A | 12/1992 |
| JP | 04-368851 A | 12/1992 |
| JP | 05-318724 A | 12/1993 |
| JP | 06-106725 A | 4/1994 |
| JP | 06-134985 A | 5/1994 |
| JP | 06-336011 A | 12/1994 |
| SE | 9601403 | 10/1997 |
| WO | WO 86/05722 | 10/1986 |
| WO | WO 97/12689 A | 4/1997 |

* cited by examiner

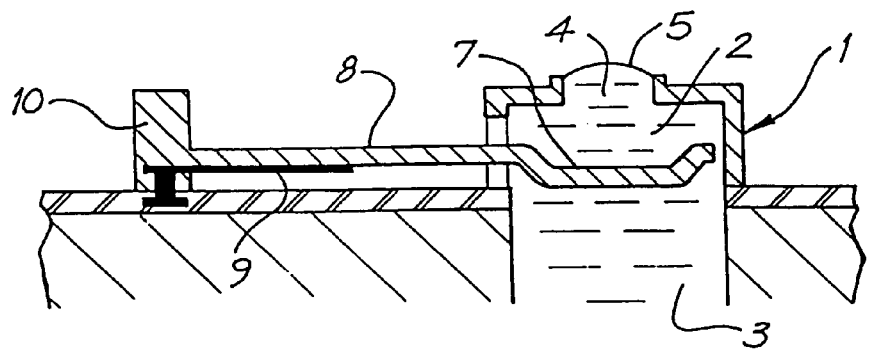
FIG. 1
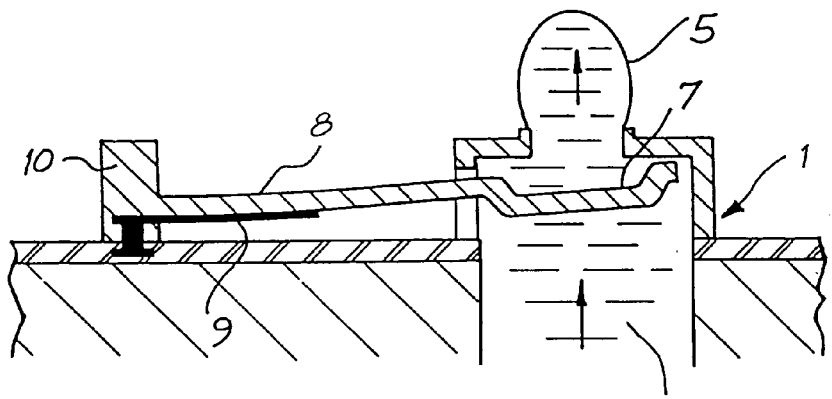
FIG. 2
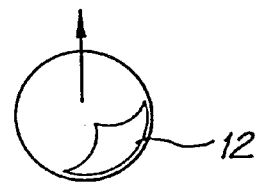
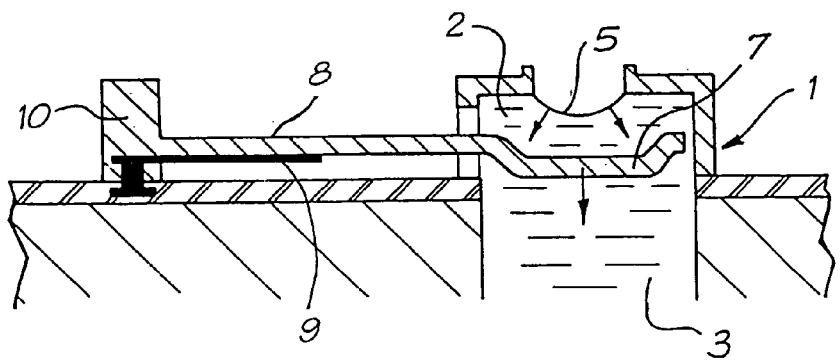
FIG. 3

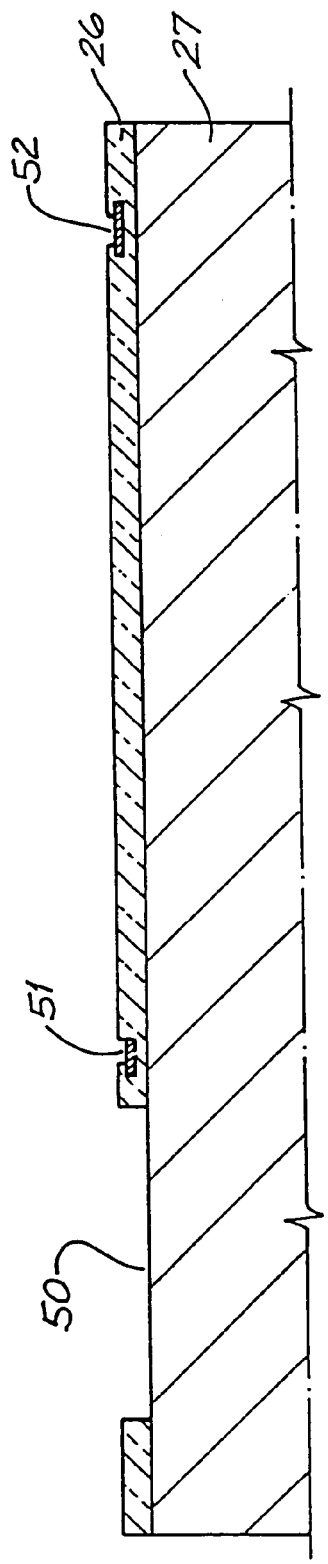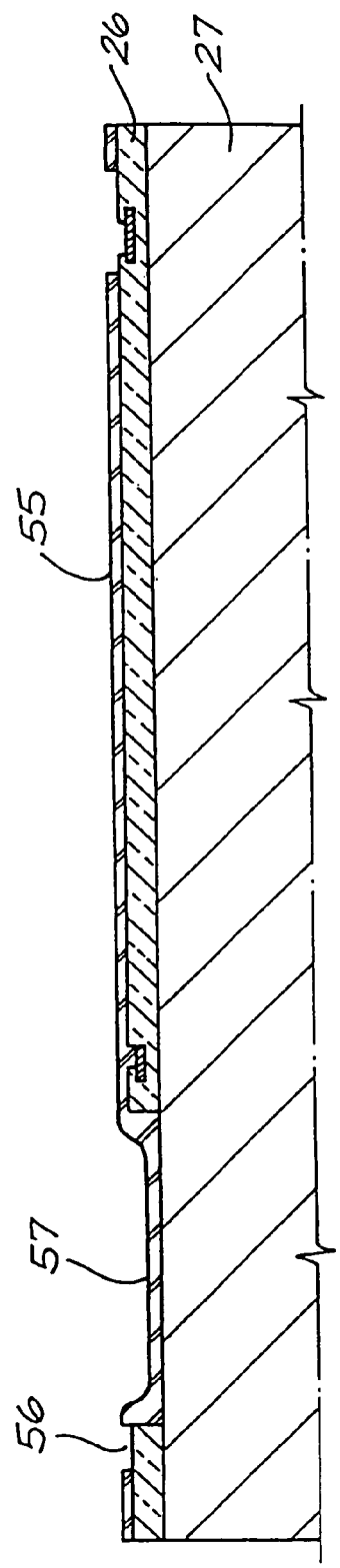

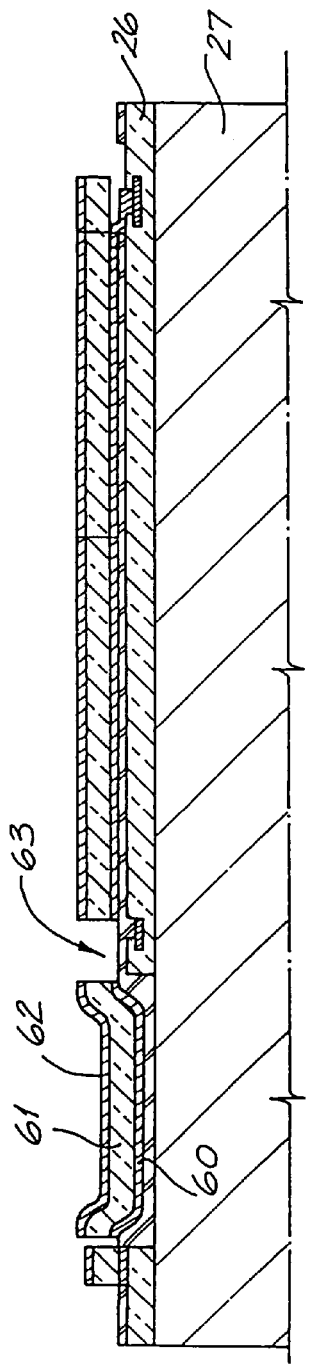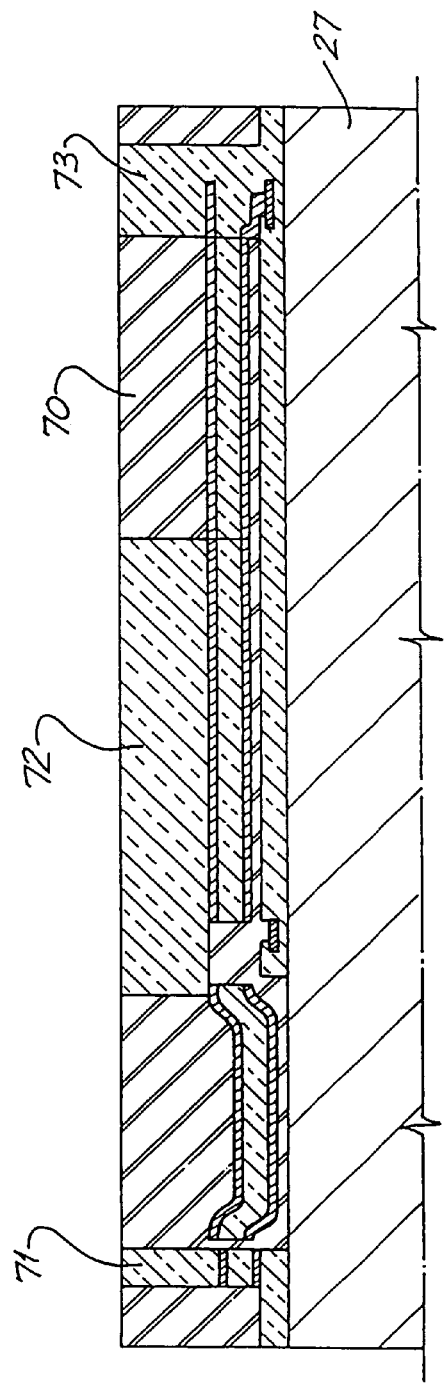

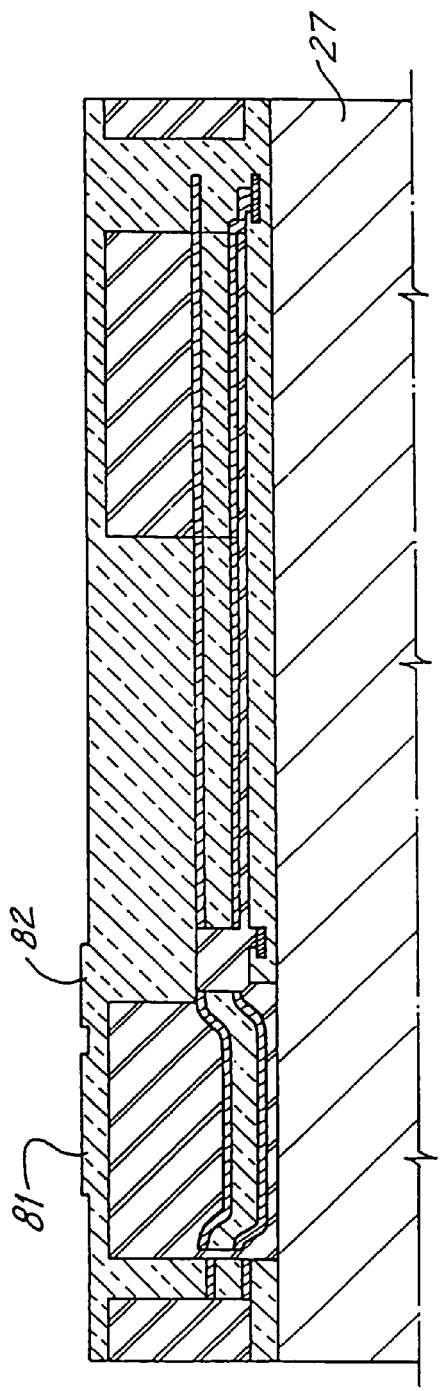
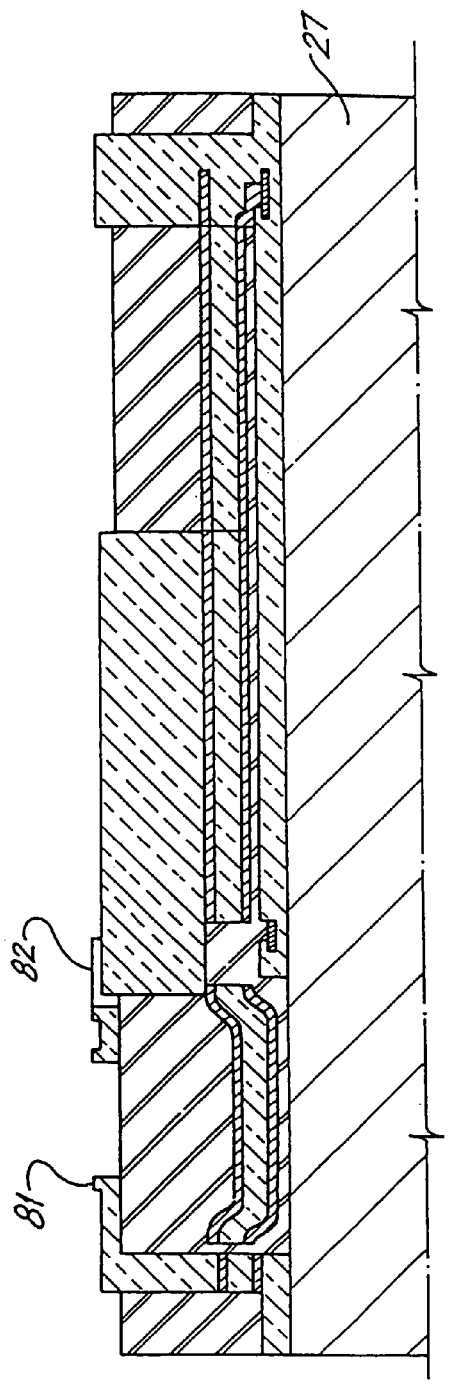

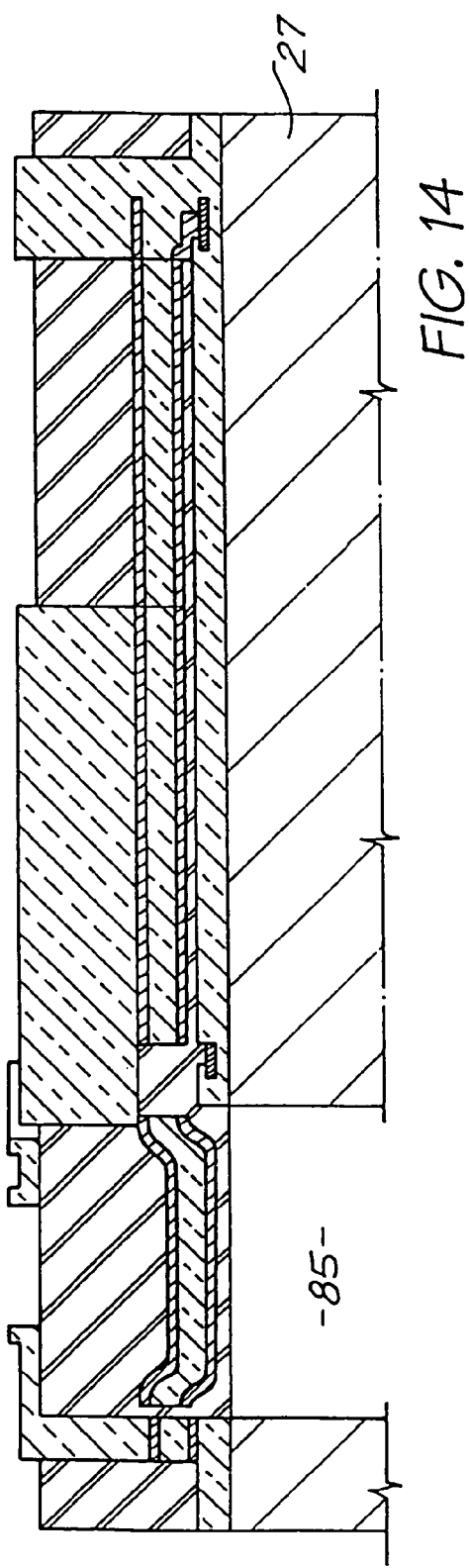
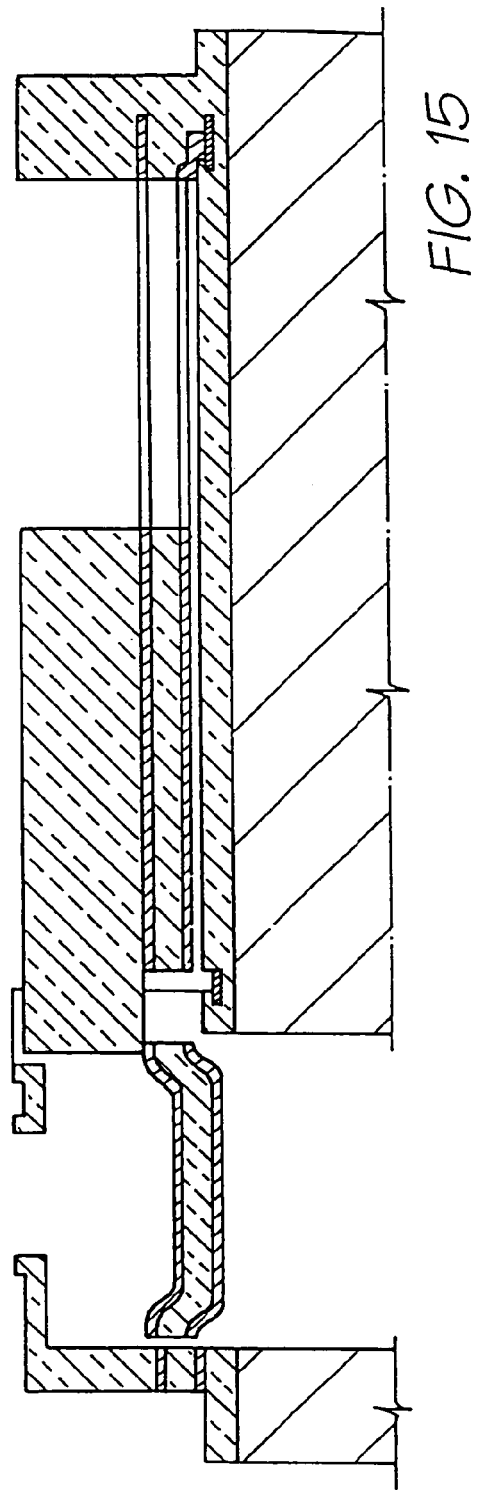
FIG. 14
FIG. 15

MICRO-ELECTROMECHANICAL INK EJECTION DEVICE WITH AN ELONGATE ACTUATOR

CROSS-REFERENCES TO RELATED APPLICATIONS

This is a Continuation Application of U.S. Application Ser. No. 10/933,286 filed on Sep. 3, 2004, now issued U.S. Pat. No. 7,125,102, which is a Continuation Application of U.S. application Ser. No. 10/728,920 filed on Dec. 8, 2003, now issued U.S. Pat. No. 6,786,574, which is a Continuation Application of U.S. application Ser. No. 10/309,080 filed on Dec. 4, 2002, now issued U.S. Pat. No. 6,682,176, which is a CIP Application of U.S. application Ser. No. 09/113,122, filed on Jul. 10, 1998, now issued U.S. Pat. No. 6,557,977, all of which are herein incorporated by reference.

FIELD OF THE INVENTION

The present invention relates to micro-electromechanical fluid ejection devices.

BACKGROUND OF THE INVENTION

Many different types of printing have been invented, a large number of which are presently in use. The known forms of printers have a variety of methods for marking the print media with relevant marking media. Commonly used forms of printing include offset printing, laser printing and copying devices, dot matrix type impact printers, thermal paper printers, film recorders, thermal wax printers, dye sublimation printers and ink jet printers both of the drop on demand and continuous flow type. Each type of printer has its own advantages and problems when considering cost, speed, quality, reliability, simplicity of construction and operation etc.

In recent years, the field of ink jet printing, wherein each individual pixel of ink is derived from one or more ink nozzles has become increasingly popular primarily due to its inexpensive and versatile nature.

Many different techniques on inkjet printing have been invented. For a survey of the field, reference is made to an article by J Moore, "Non-Impact Printing: Introduction and Historical Perspective", Output Hard Copy Devices, Editors R Dubeck and S Sherr, pages 207-220 (1988).

Ink Jet printers themselves come in many different types. The utilisation of a continuous stream of ink in ink jet printing appears to date back to at least 1929 wherein U.S. Pat. No. 1,941,001 by Hansell discloses a simple form of continuous stream electro-static ink jet printing.

U.S. Pat. No. 3,596,275 by Sweet also discloses a process of continuous ink jet printing including the step wherein the ink jet stream is modulated by a high frequency electrostatic field so as to cause drop separation. This technique is still utilized by several manufacturers including Elmjet and Scitex (see also U.S. Pat. No. 3,373,437 by Sweet et al)

Piezoelectric ink jet printers are also one form of commonly utilized ink jet printing device. Piezoelectric systems are disclosed by Kyser et. al. in U.S. Pat. No. 3,946,398 (1970) which utilizes a diaphragm mode of operation, by Zolten in U.S. Pat. No. 3,683,212 (1970) which discloses a squeeze mode of operation of a piezoelectric crystal, by Stemme in U.S. Pat. No. 3,747,120 (1972) which discloses a bend mode of piezoelectric operation, Howkins in U.S. Pat. No. 4,459,601 which discloses a piezoelectric push mode actuation of the ink jet stream and by Fischbeck in U.S. Pat. No. 4,584,590 which discloses a shear mode type of piezoelectric transducer element.

Recently, thermal ink jet printing has become an extremely popular form of ink jet printing. The ink jet printing techniques include those disclosed by Endo et al in GB 2007162 (1979) and by Vaught et al in U.S. Pat. No. 4,490,728. Both the aforementioned reference ink jet printing techniques rely upon the activation of an electrothermal actuator which results in the creation of a bubble in a constricted space, such as a nozzle, which thereby causes the ejection of ink from an aperture in communication with the confined space onto a relevant print media Manufacturers such as Canon and Hewlett Packard manufacture printing devices utilizing the electrothermal actuator.

As can be seen from the foregoing, many different types of printing technologies are available. Ideally, a printing technology should have a number of desirable attributes. These include inexpensive construction and operation, high-speed operation, safe and continuous long-term operation etc. Each technology may have its own advantages and disadvantages in the areas of cost, speed, quality, reliability, power usage, simplicity of construction, operation, durability and consumables.

In the construction of any inkjet printing system, there are a considerable number of important factors which must be traded off against one another especially as large scale printheads are constructed, especially those of a pagewidth type. A number of these factors are outlined in the following paragraphs.

Firstly, inkjet printheads are normally constructed utilizing micro-electromechanical systems (MEMS) techniques. As such, they tend to rely upon the standard integrated circuit construction/fabrication techniques of depositing planar layers on a silicon wafer and etching certain portions of the planar layers. Within silicon circuit fabrication technology, certain techniques are better known than others. For example, the techniques associated with the creation of CMOS circuits are likely to be more readily used than those associated with the creation of exotic circuits including ferroelectrics, gallium arsenide etc. Hence, it is desirable, in any MEMS construction, to utilize well-proven semi-conductor fabrication techniques that do not require the utilization of any "exotic" processes or materials. Of course, a certain degree of trade off will be undertaken in that if the use of the exotic material far outweighs its disadvantages then it may become desirable to utilize the material anyway.

With a large array of ink ejection nozzles, it is desirable to provide for a highly automated form of manufacturing which results in an inexpensive production of multiple printhead devices.

Preferably, the device constructed utilizes a low amount of energy in the ejection of ink. The utilization of a low amount of energy is particularly important when a large pagewidth full color printhead is constructed having a large array of individual print ejection mechanisms with each ejection mechanism, in the worst case, being fired in a rapid sequence.

In the parent application, namely U.S. application Ser. No. 09/113,122 there is disclosed a printhead chip having a plurality of nozzle arrangements. These nozzle arrangements each include an actuator. The actuator has two pairs of actuating arms, each pair comprising an active actuating arm and a passive actuating arm. The active actuating arms are configured so that when heated upon receipt of an electrical signal, they deform and drive an ink displacement mechanism so that ink can be ejected from the respective nozzle chambers. The passive actuating arms serve to provide resilient flexibility and stability to the actuator.

The Applicant has found that it is desirable that the actuator has a certain configuration to avoid buckling of the actuator when the active actuating arms are deformed to displace the actuator. While avoiding buckling, this configuration must also maintain efficiency of the actuator. This configuration is the subject of this invention.

SUMMARY OF THE INVENTION

According to a first aspect of the invention there is provided a micro-electromechanical fluid ejection device that comprises a substrate that defines a fluid inlet channel and incorporates a wafer and drive circuitry positioned on the wafer;

nozzle chamber walls that extend from the substrate and bound the fluid inlet channel to define a nozzle chamber in fluid communication with the fluid inlet channel and a fluid ejection port; and an elongate actuator that is connected at one end to the drive circuitry, an opposite end of the actuator being displaceable towards and away from the substrate on receipt of an electrical signal from the drive circuitry, the actuator including an interconnect portion that defines a transversely extending face and is received through a complementary opening defined in the walls and a fluid ejection member that is fast with said face, the interconnect portion and said opening being shaped so that movement of the fluid ejection member is controlled.

The actuator may include an elongate actuator arm and a heater element capable of thermal expansion mounted on the actuator arm. The heater element may define an electrical circuit and may be connected to the drive circuitry to receive an electrical current from the drive circuitry. The heater element may be positioned so that resultant thermal expansion of the heater element results in the actuator being bent away from the substrate, thereby displacing the fluid ejection member towards the fluid ejection port to eject fluid from the fluid ejection port.

The heater element may be positioned on one side of the actuator arm to be interposed between the actuator arm and the substrate. The actuator may include a complementary element, having a similar Young's modulus to that of the heater element, positioned on an opposite side of the actuator arm.

The interconnect portion may include a block member that is fast with the actuator arm, and a pair of opposed, transversely extending members fast with the block member and defining the transversely extending face, the walls defining slotted openings to accommodate the block member and the transversely extending members so that fluid outflow through the openings is minimized.

A rim may bound the slotted openings to minimize wicking of fluid along the walls.

A recess may be defined in the substrate proximate the opening to inhibit wicking of fluid along the substrate.

According to a second aspect of the invention, there is provided a micro-electromechanical fluid ejection device that comprises a substrate that defines a fluid inlet channel and incorporates a wafer and CMOS layers positioned on the wafer;

a wall that extends from the substrate and bounds the fluid inlet channel;

an elongate actuator that is connected at one end to the CMOS layers, an opposite end of the actuator being displaceable towards and away from the substrate on receipt of an electrical signal from the CMOS layers; and a nozzle that is connected to said opposite end of the actuator, the nozzle having a crown portion and a skirt portion that depends from the crown portion, the crown portion defining a fluid ejection port and the skirt portion being positioned so that the nozzle and the wall define a chamber in fluid communication with the fluid inlet channel and a volume of the fluid chamber is reduced and subsequently enlarged as the nozzle is driven towards and away from the nozzle chamber by the actuator to eject fluid from the fluid ejection port.

An edge of the skirt portion may be positioned adjacent an edge of the wall such that, when the chamber is filled with liquid, a meniscus is pinned by the edges of the skirt portion and the wall to define a fluidic seal that inhibits the egress of liquid from between the wall and the skirt as liquid is ejected from the fluid ejection port.

The crown portion may include a rim that defines the fluid ejection port, the rim providing an anchor point for a meniscus that is formed in the fluid ejection port when the chamber is filled with liquid.

An arm interconnects said opposite end of the actuator and the nozzle.

The actuator may include a pair of active beams that are anchored and electrically connected to the CMOS layers and a flexible passive structure that is anchored to and electrically insulated from the CMOS layers. Both the active beams and the passive structure may be connected to the arm. The active beams may define a heating circuit and may be of a thermally expandable material. The passive structure may be interposed between the active beams and the substrate such that, when the active beams are heated by an electrical current, which is subsequently cut off, the active beams expand and contract, causing said opposite end of the actuator and thus the arm and the nozzle to be driven towards and away from the substrate.

The passive structure may be in the form of a pair of passive beams of the same material as the active beams. The active beams may be spaced from the passive beams so that spacing between the active beams and the passive beams is greater than one percent of a length of the actuator and less than twenty percent of the length of the actuator.

According to a third aspect of the invention, there is provided a micro-electromechanical fluid ejection device which comprises a substrate that defines a plurality of fluid inlet channels and incorporates a wafer and CMOS layers positioned on the wafer;

walls that extend from the substrate to bound respective fluid inlet channels;

elongate actuators that are connected at one end to the CMOS layers, an opposite end of each actuator being displaceable towards and away from the substrate on receipt of an electrical signal from the CMOS layers; and nozzles that are connected to respective said opposite end of the actuators, each nozzle having a crown portion and a skirt portion that depends from the crown portion, the crown portion defining a fluid ejection port and the skirt portion being positioned so that the nozzle and a respective wall define a chamber in fluid communication with the fluid inlet channel and a volume of the fluid chamber is reduced and subsequently enlarged as the nozzle is driven towards and away from the nozzle chamber by the actuator to eject fluid from the fluid ejection port.

In general, there is disclosed herein an ink jet nozzle assembly including a nozzle chamber and a nozzle, the chamber including a movable portion and an actuating arm connected to or formed integrally with the movable portion and functioning in use to move said movable portion selectively to eject ink from the chamber via said nozzle, the actuating arm having portions with equivalent thermal expansion characteristics so as to avoid differential thermal expansion in response to changes in ambient temperature.

Preferably the actuating arm is formed of materials having equivalent thermal expansion characteristics and a current is passed through only a portion of the actuating arm to effect said movement.

Preferably said nozzle chamber has an inlet in fluid communication with an ink reservoir. The nozzle chamber may include a fixed portion configured with said movable portion such that relative movement in an ejection phase reduces an effective volume of the chamber, and alternate relative movement in a refill phase enlarges the effective volume of the chamber;

Portions of the actuating arms may be spaced apart and are adapted for selective differential thermal expansion upon heating so as to effect said relative movement.

The inlet may be positioned and dimensioned relative to the nozzle such that ink is ejected preferentially from the chamber through said nozzle in droplet form in the ejection phase, and ink is alternately drawn preferentially into the chamber from the reservoir through the inlet in the refill phase.

Preferably, said movable portion includes the nozzle and the fixed portion is mounted on a substrate.

Preferably the actuating arm effectively extends between the movable portion and the substrate.

Preferably the fixed portion includes the nozzle mounted on a substrate and the movable portion includes an ejection paddle.

Preferably the actuating arm is located substantially within the chamber.

Alternatively the actuating arm is located substantially outside the chamber.

Preferably the fixed portion includes a slotted sidewall in the chamber through which the actuating arm is connected to the movable portion.

Preferably the actuating arm has two portions that are of substantially the same cross-sectional profile relative to one another.

Alternatively the portions of the actuating arm are of different cross-sectional profiles relative to one another.

Preferably the portions are of substantially the same material composition relative to one another.

Alternatively the portions are of different material composition relative to one another.

Preferably the portions are substantially parallel to one another.

Alternatively the portions are substantially non-parallel to one another.

Preferably one portion is adapted to be heated to a higher temperatures than the other portion in order to effect thermal actuation.

Preferably the respective portions are formed from multiple layers of different material compositions disposed such that thermal expansion or contraction in one portion due to the ambient temperature fluctuations is balanced by a substantially corresponding thermal expansion or contraction in the other portion.

Preferably the assembly is manufactured using micro-electro-mechanical-systems (MEMS) techniques.

Preferably an electric current is passed through one said portion arm and not the other said portion in use.

According to a fourth aspect of the invention, there is provided an ink jet printhead chip that comprises a substrate;

a plurality of nozzle arrangements positioned on the substrate, each nozzle arrangement comprising nozzle chamber walls that define a nozzle chamber and an ink ejection port in fluid communication with the nozzle chamber;

an actuator that is connected to the substrate and is displaceable with respect to the substrate upon receipt of a control signal, the actuator being operatively arranged with respect to the nozzle chamber to eject ink from the ink ejection port on displacement of the actuator; wherein the actuator includes an actuating arm that has at least one active portion that is configured to be displaced upon receipt of the control signal and at least one corresponding passive portion, the, or each, active portion being spaced from its corresponding passive portion in a plane that spans the substrate, so that spacing between the, or each, active portion and its corresponding passive portion is greater than one percent of a length of the actuating arm and less than twenty percent of the length of the actuating arm.

The actuator may include at least two pairs of corresponding active and passive portions.

Each active portion may be in the form of an elongate active beam and each passive portion may be in the form of an elongate passive beam.

The spacing between each active beam and its associated passive beam may be greater than five percent of the length of the actuating arm and less than ten percent of the length of the actuating arm.

The actuator may include an ink ejecting mechanism that is operatively positioned with respect to the nozzle chamber. An end of the actuating arm may be anchored to the substrate and an opposed end of the actuating arm may be connected to the ink ejecting mechanism so that displacement of the actuating arm results in the ink ejecting mechanism ejecting ink from the ink ejection port.

The invention extends to an ink jet printhead, which comprises at least one ink jet printhead chip as described above.

BRIEF DESCRIPTION OF THE DRAWINGS

Notwithstanding any other forms, which may fall within the scope of the present invention, preferred forms of the invention will now be described, by way of example only, with reference to the accompanying drawings in which:

FIGS. 1-3 illustrate the operational principles of the preferred embodiment;

FIGS. 8-15 illustrate the manufacturing steps in the construction of the preferred embodiment;

DESCRIPTION OF PREFERRED AND OTHER EMBODIMENTS

Figure 4:
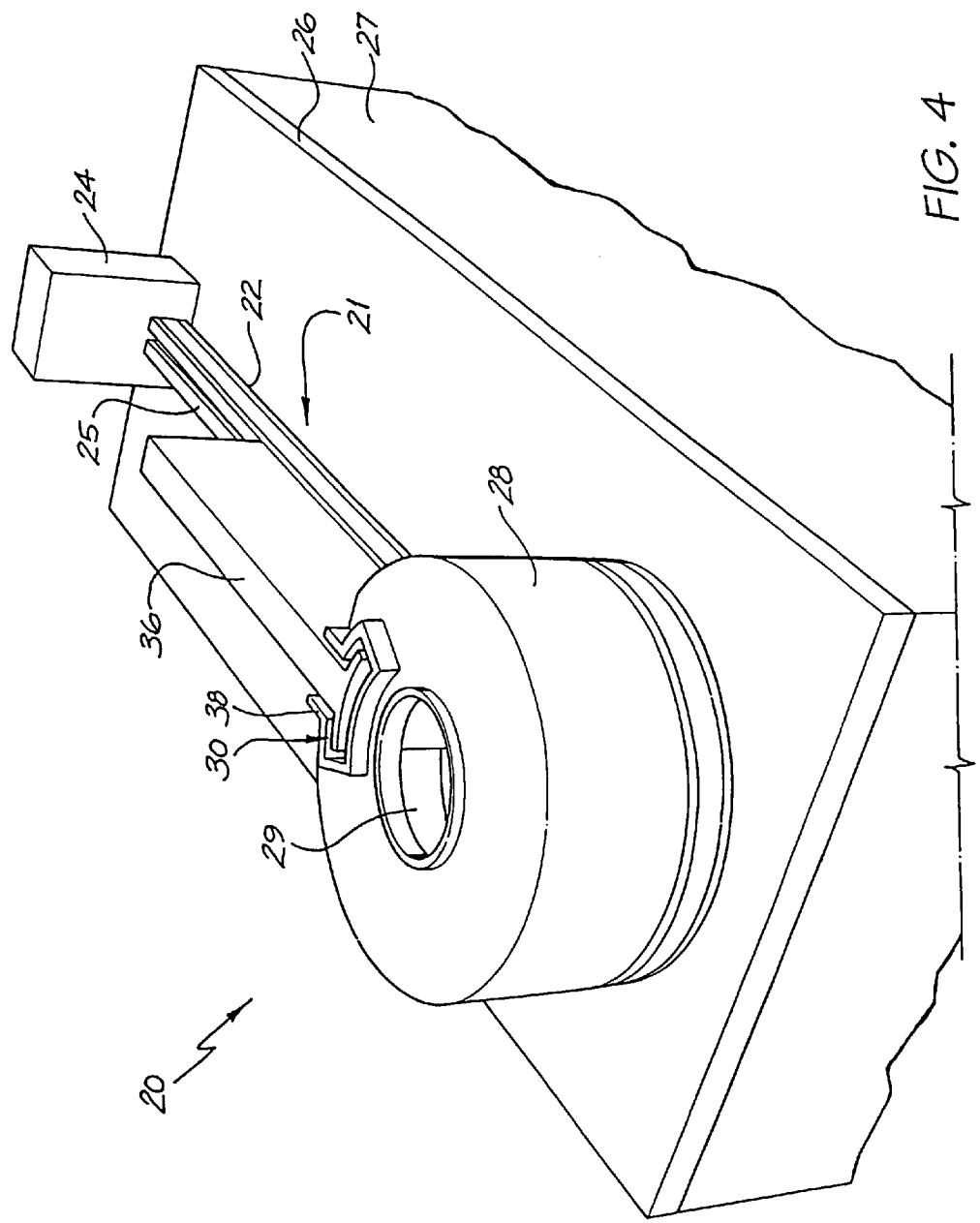
FIG. 4 is a side perspective view of a single nozzle arrangement of the preferred embodiment.

In the preferred embodiment, there is provided a nozzle chamber having ink within it and a thermal actuator device interconnected to an ink ejecting mechanism in the form of a paddle, the thermal actuator device being actuated so as to eject ink from the nozzle chamber. The preferred embodiment includes a particular thermal actuator structure which includes an actuator arm in the form of a tapered heater structure arm for providing positional heating of a conductive heater layer row. The actuator arm is connected to the paddle through a slotted wall in the nozzle chamber. The actuator arm has a mating shape so as to mate substantially with the surfaces of the slot in the nozzle chamber wall.

Turning initially to FIGS. 1-3, there is provided schematic illustrations of the basic operation of the device. A nozzle chamber 1 is provided filled with ink 2 by means of an ink inlet channel 3 which can be etched through a wafer substrate on which the nozzle chamber 1 rests. The nozzle chamber 1 includes an ink ejection nozzle or aperture 4 around which an ink meniscus forms.

Inside the nozzle chamber 1 is a paddle type device 7 which is connected to an actuator arm 8 through a slot in the wall of the nozzle chamber 1. The actuator arm 8 includes a heater means 9 located adjacent to a post end portion 10 of the actuator arm. The post 10 is fixed to a substrate.

When it is desired to eject a drop from the nozzle chamber, as illustrated in FIG. 2, the heater means 9 is heated so as to undergo thermal expansion. Preferably, the heater means itself or the other portions of the actuator arm 8 are built from materials having a high bend efficiency where the bend efficiency is defined as $$\text{bend efficiency} = \frac{\text{Young's Modulus} \times (\text{Coefficient of thermal Expansion})}{\text{Density} \times \text{Specific Heat Capacity}}$$

A suitable material for the heater elements is a copper nickel alloy which can be formed so as to bend a glass material.

The heater means is ideally located adjacent the post end portion 10 such that the effects of activation are magnified at the paddle end 7 such that small thermal expansions near post 10 result in large movements of the paddle end. The heating 9 causes a general increase in pressure around the ink meniscus 5 which expands, as illustrated in FIG. 2, in a rapid manner. The heater current is pulsed and ink is ejected out of the nozzle 4 in addition to flowing in from the ink channel 3. Subsequently, the paddle 7 is deactivated to again return to its quiescent position. The deactivation causes a general reflux of the ink into the nozzle chamber. The forward momentum of the ink outside the nozzle rim and the corresponding backflow results in a general necking and breaking off of a drop 12 which proceeds to the print media. The collapsed meniscus 5 results in a general sucking of ink into the nozzle chamber 1 via the in flow channel 3. In time, the nozzle chamber is refilled such that the position in FIG. 1 is again reached and the nozzle chamber is subsequently ready for the ejection of another drop of ink.

Turning now to FIG. 4, there is illustrated a single nozzle arrangement 20 of the preferred embodiment. The arrangement includes an actuator arm 21 which includes a bottom layer 22 which is constructed from a conductive material such as a copper nickel alloy (hereinafter called cupronickel) or titanium nitride (TiN). The layer 22, as will become more apparent hereinafter includes a tapered end portion near the end post 24. The tapering of the layer 22 near this end means that any conductive resistive heating occurs near the post portion 24.

The layer 22 is connected to the lower CMOS layers 26 which are formed in the standard manner on a silicon substrate surface 27. The actuator arm 21 is connected to an ejection paddle which is located within a nozzle chamber 28. The nozzle chamber 28 includes an ink ejection nozzle 29 from which ink is ejected and includes a convoluted slot arrangement 30 which is constructed such that the actuator arm 21 is able to move up and down while causing minimal pressure fluctuations in the area of the nozzle chamber 28 around the slot 30.

Figure 5:
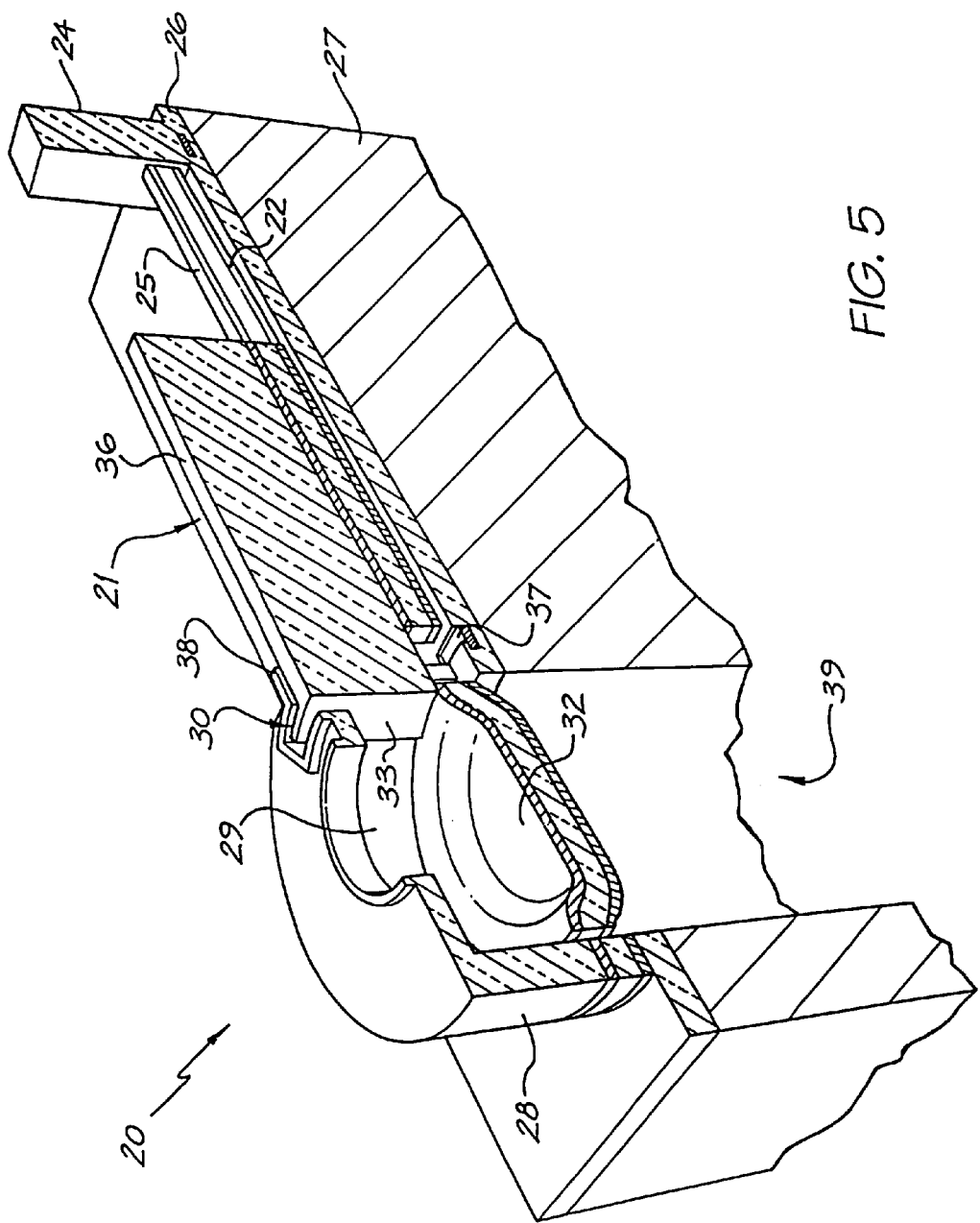
FIG. 5 illustrates a sectional side view of a single nozzle arrangement.

FIG. 5 illustrates a sectional view through a single nozzle. FIG. 5 illustrates more clearly the internal structure of the nozzle chamber which includes the paddle 32 attached to the actuator arm 21 having face 33. Importantly, the actuator arm 21 includes, as noted previously, a bottom conductive layer 22. Additionally, a top layer 25 is also provided.

Figure 6:
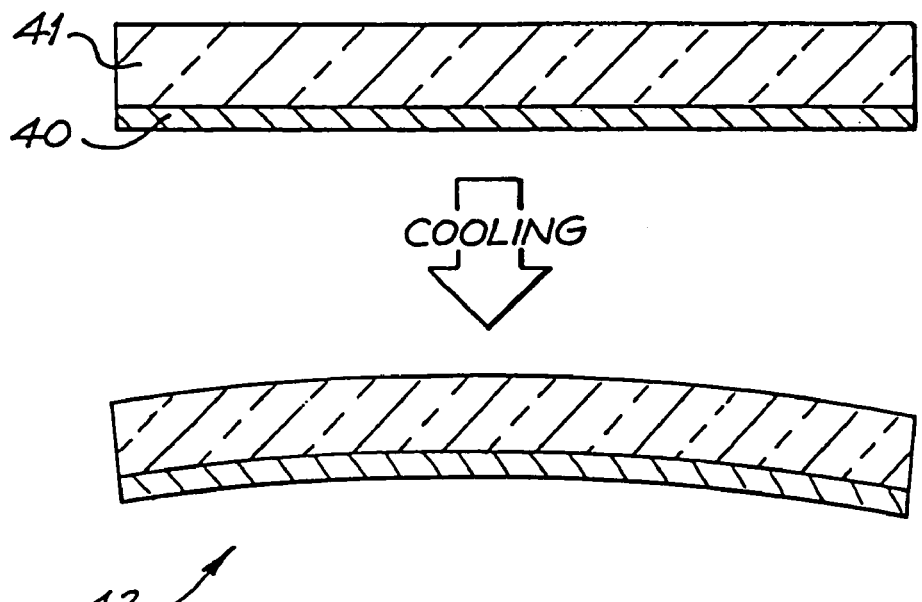
FIGS. 6 and 7 illustrate operational principles of the preferred embodiment.

The utilization of a second layer 25 of the same material as the first layer 22 allows for more accurate control of the actuator position as will be described with reference to FIGS. 6 and 7. In FIG. 6, there is illustrated the example where a high Young's Modulus material 40 is deposited utilizing standard semiconductor deposition techniques and on top of which is further deposited a second layer 41 having a much lower Young's Modulus. Unfortunately, the deposition is likely to occur at a high temperature. Upon cooling, the two layers are likely to have different coefficients of thermal expansion and different Young's Moduli. Hence, in ambient room temperature, the thermal stresses are likely to cause bending of the two layers of material as shown at 42.

Figure 7:
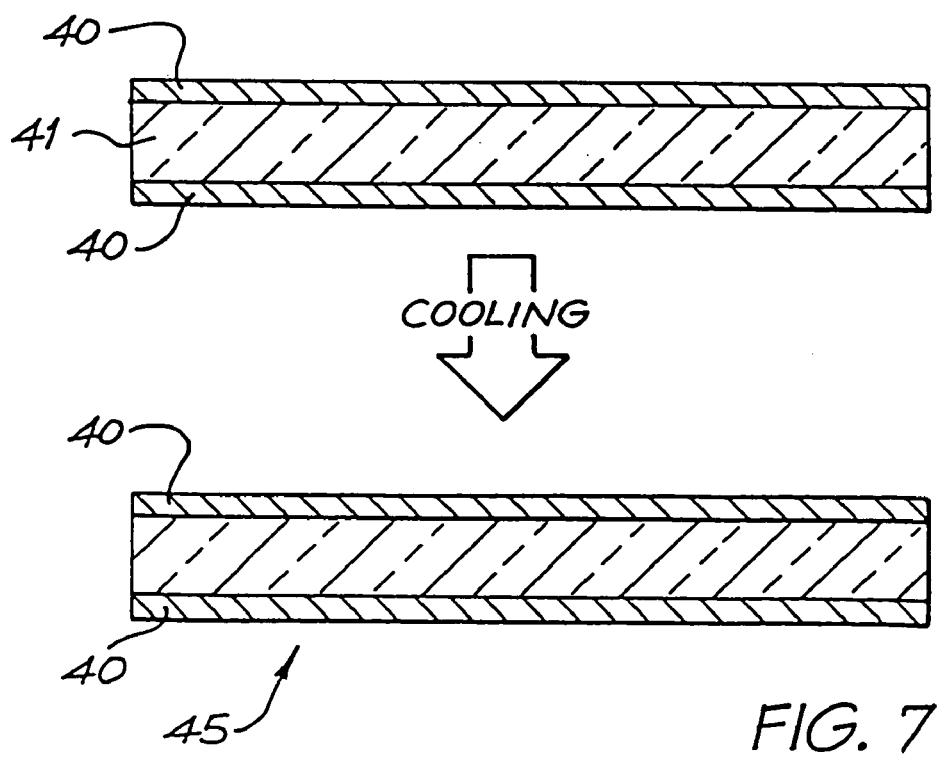

By utilizing a second deposition of the material having a high Young's Modulus, the situation in FIG. 7 is likely to result wherein the material 41 is sandwiched between the two layers 40. Upon cooling, the two layers 40 are kept in tension with one another so as to result in a more planar structure 45 regardless of the operating temperature. This principle is utilized in the deposition of the two layers 22, 25 of FIGS. 4-5.

Turning again to FIGS. 4 and 5, one important attribute of the preferred embodiments includes the slotted arrangement 30. The slotted arrangement results in the actuator arm 21 moving up and down thereby causing the paddle 32 to also move up and down resulting in the ejection of ink. The slotted arrangement 30 results in minimum ink outflow through the actuator arm connection and also results in minimal pressure increases in this area. The face 33 of the actuator arm is extended out so as to form an extended interconnect with the paddle surface thereby providing for better attachment. The face 33 is connected to a block portion 36 which is provided to provide a high degree of rigidity. The actuator arm 21 and the wall of the nozzle chamber 28 have a generally corrugated nature so as to reduce any flow of ink through the slot 30. The exterior surface of the nozzle chamber adjacent the block portion 36 has a rim eg. 38 so to minimize wicking of ink outside of the nozzle chamber. A pit 37 is also provided for this purpose. The pit 37 is formed in the lower CMOS layers 26. An ink supply channel 39 is provided by means of back etching through the wafer to the back surface of the nozzle.

Turning to FIGS. 8-15 there will now be described fabrication steps utilized in the construction of a single nozzle in accordance with the preferred embodiment.

The fabrication uses standard micro-electromechanical techniques. For a general introduction to a micro-electromechanical systems (MEMS) reference is made to standard proceedings in this field including the proceeding of the SPIE (International Society for Optical Engineering) including volumes 2642 and 2882 which contain the proceedings of recent advances and conferences in this field.

1. The preferred embodiment starts with a double sided polished wafer complete with, say, a 0.2 µm 1 poly 2 metal CMOS process providing for all the electrical interconnects necessary to drive the inkjet nozzle.

2. As shown in FIG. 8, the CMOS wafer 26 is etched at 50 down to the silicon layer 27. The etching includes etching down to an aluminum CMOS layer 51, 52.

3. Next, as illustrated in FIG. 9, a 1 µm layer of sacrificial material 55 is deposited. The sacrificial material can be aluminum or photosensitive polyimide.

4. The sacrificial material is etched in the case of aluminum or exposed and developed in the case of polyimide in the area of the nozzle rim 56 and including a dished paddle area 57.

5. Next, a 1 µm layer of heater material 60 (cupronickel or TiN) is deposited.

6. A 3.4 µm layer of PECVD glass 61 is then deposited.

7. A second layer 62 equivalent to the first layer 60 is then deposited.

8. All three layers 60-62 are then etched utilizing the same mask. The utilization of a single mask substantially reduces the complexity in the processing steps involved in creation of the actuator paddle structure and the resulting structure is as illustrated in FIG. 10. Importantly, a break 63 is provided so as to ensure electrical isolation of the heater portion from the paddle portion.

9. Next, as illustrated in FIG. 11, a 10 µm layer of sacrificial material 70 is deposited.

10. The deposited layer is etched (or just developed if polyimide) utilizing a fourth mask which includes nozzle rim etchant holes 71, block portion holes 72 and post portion 73.

11. Next a 10 µm layer of PECVD glass is deposited so as to form the nozzle rim 71, arm portions 72 and post portions 73.

12. The glass layer is then planarized utilizing chemical mechanical planarization (CMP) with the resulting structure as illustrated in FIG. 11.

13. Next, a 3 µm layer of PECVD glass is deposited.

14. The deposited glass is then etched as shown in FIG. 12, to a depth of approximately 1 µm so as to form nozzle rim portion 81 and actuator interconnect portion 82.

15. Next, as illustrated in FIG. 13, the glass layer is etched utilizing a 6th mask so as to form final nozzle rim portion 81 and actuator guide portion 82.

16. Next, as illustrated in FIG. 14, the ink supply channel is back etched 85 from the back of the wafer utilizing a 7th mask. The etch can be performed utilizing a high precision deep silicon trench etcher such as the STS Advanced Silicon Etcher (ASE). This step can also be utilized to nearly completely dice the wafer.

17. Next, as illustrated in FIG. 15 the sacrificial material can be stripped or dissolved to also complete dicing of the wafer in accordance with requirements.

18. Next, the printheads can be individually mounted on attached molded plastic ink channels to supply ink to the ink supply channels.

19. The electrical control circuitry and power supply can then be bonded to an etch of the printhead with a TAB film.

20. Generally, if necessary, the surface of the printhead is then hydrophobized so as to ensure minimal wicking of the ink along external surfaces. Subsequent testing can determine operational characteristics.

Figure 16:
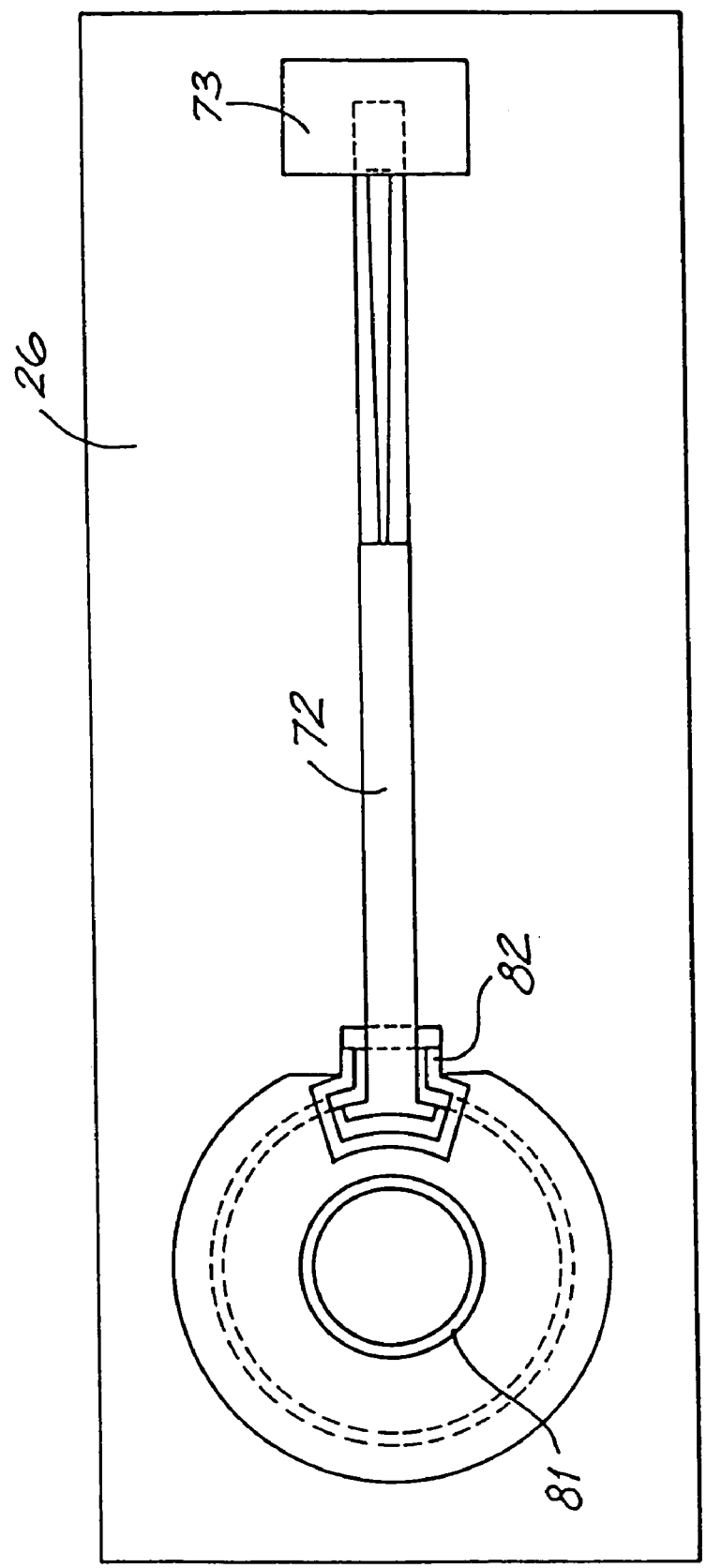
FIG. 16 illustrates a top plan view of a single nozzle.

Importantly, as shown in the plan view of FIG. 16, the heater element has a tapered portion adjacent the post 73 so as to ensure maximum heating occurs near the post.

Figure 17:
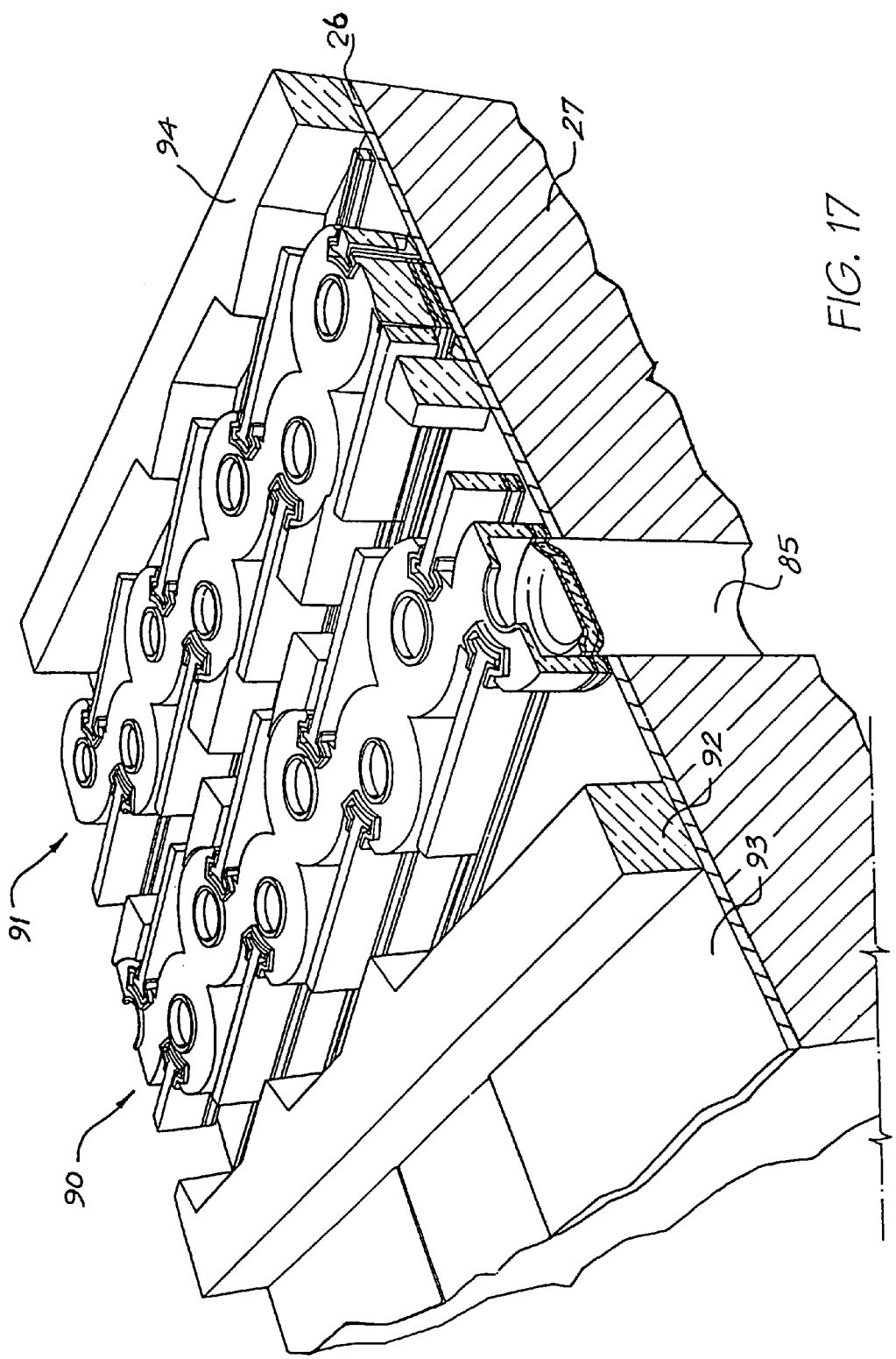
FIG. 17 illustrates a portion of a single color printhead device.

Of course, different forms of inkjet printhead structures can be formed. For example, there is illustrated in FIG. 17, a portion of a single color printhead having two spaced apart rows 90, 91, with the two rows being interleaved so as to provide for a complete line of ink to be ejected in two stages. Preferably, a guide rail 92 is provided for proper alignment of a TAB film with bond pads 93. A second protective barrier 94 can also preferably be provided. Preferably, as will become more apparent with reference to the description of FIG. 18 adjacent actuator arms are interleaved and reversed.

Figure 18:
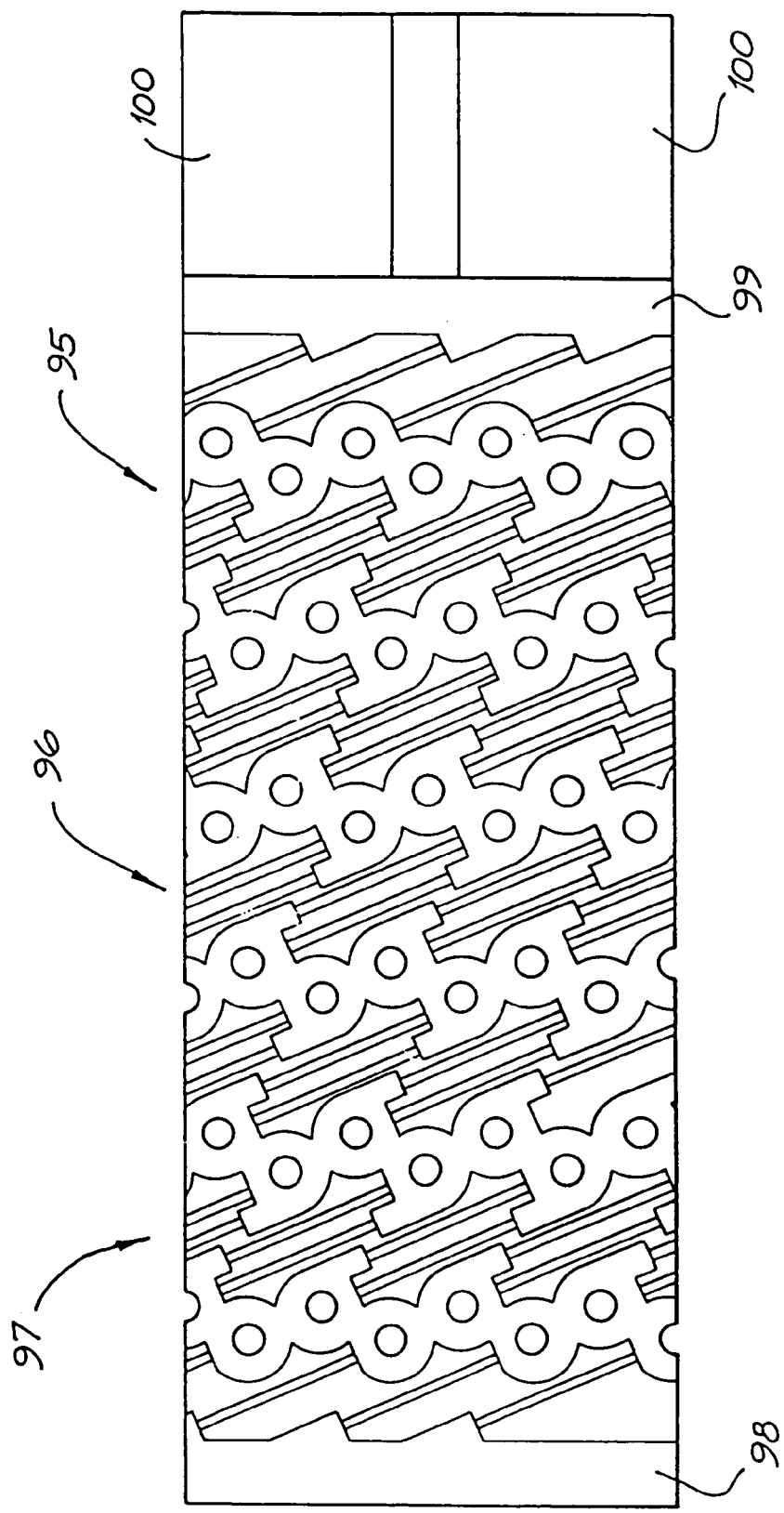
FIG. 18 illustrates a portion of a three-color printhead device.

Turning now to FIG. 18, there is illustrated a full color printhead arrangement which includes three series of inkjet nozzles 95, 96, 97 one each devoted to a separate color. Again, guide rails 98, 99 are provided in addition to bond pads, eg. 100. In FIG. 18, there is illustrated a general plan of the layout of a portion of a full color printhead which clearly illustrates the interleaved nature of the actuator arms.

The presently disclosed ink jet printing technology is potentially suited to a wide range of printing system including: color and monochrome office printers, short run digital printers, high speed digital printers, offset press supplemental printers, low cost scanning printers high speed pagewidth printers, notebook computers with inbuilt pagewidth printers, portable color and monochrome printers, color and monochrome copiers, color and monochrome facsimile machines, combined printer, facsimile and copying machines, label printers, large format plotters, photograph copiers, printers for digital photographic "minilabs", video printers, PHOTO CD (PHOTO CD is a registered trademark of the Eastman Kodak Company) printers, portable printers for PDAs, wallpaper printers, indoor sign printers, billboard printers, fabric printers, camera printers and fault tolerant commercial printer arrays.

Figure 19:
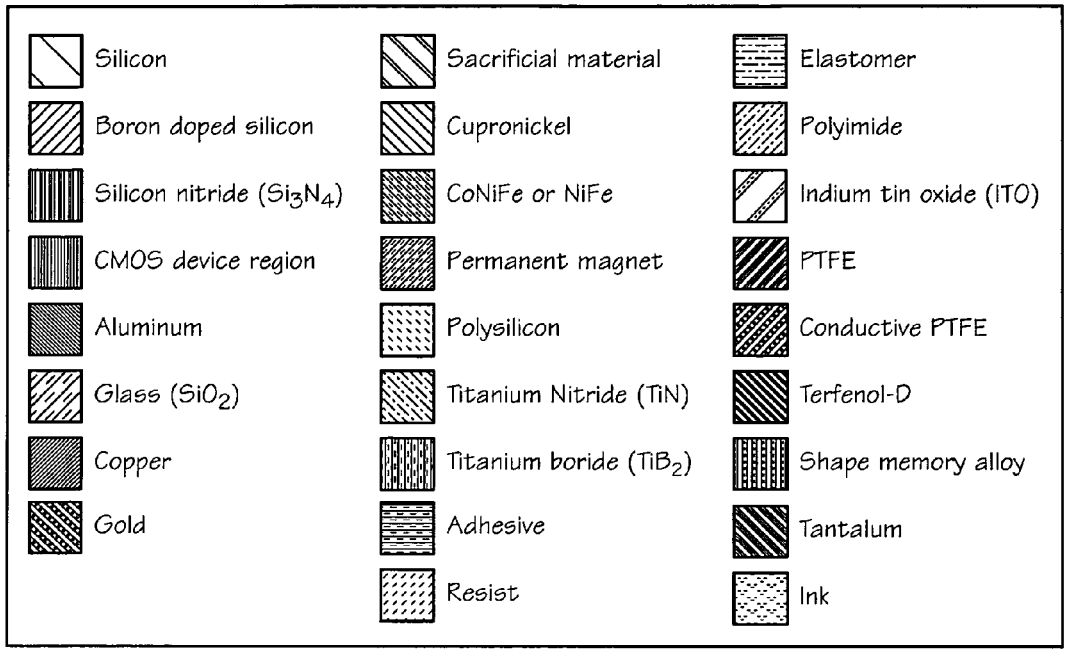
FIG. 19 provides a legend of the materials indicated in FIGS. 20 to 29.
Figure 20:
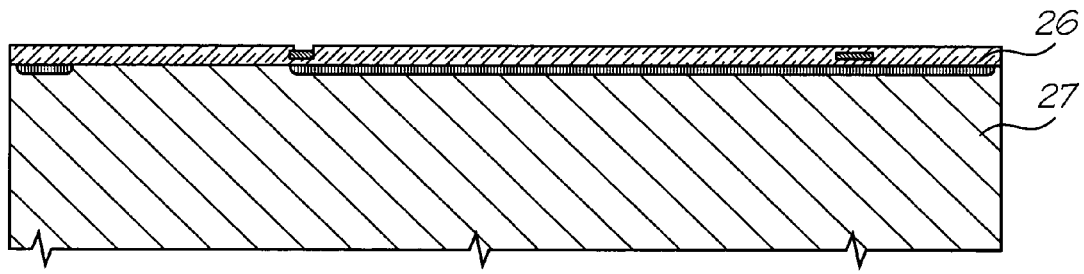
FIG. 20 to FIG. 29 illustrate sectional views of the manufacturing steps in one form of construction of an ink jet printhead nozzle.

One alternative form of detailed manufacturing process which can be used to fabricate monolithic ink jet printheads operating in accordance with the principles taught by the present embodiment can proceed utilizing the following steps:

1. Using a double sided polished wafer 27, complete drive transistors, data distribution, and timing circuits using a 0.5 micron, one poly, 2 metal CMOS process to form layer 26. Relevant features of the wafer at this step are shown in FIG. 20. For clarity, these diagrams may not be to scale, and may not represent a cross section though any single plane of the nozzle. FIG. 19 is a key to representations of various materials in these manufacturing diagrams, and those of other cross-referenced ink jet configurations.

Figure 21:
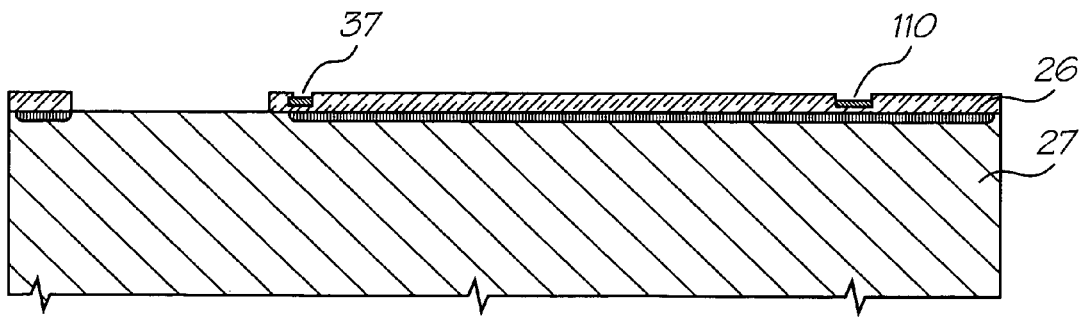

2. Etch oxide down to silicon or aluminum using Mask 1. This mask defines the nozzle chamber, the surface anti-wicking notch 37, and the heater contacts 110. This step is shown in FIG. 21.

3. Deposit 1 micron of sacrificial material 55 (e.g. aluminum or photosensitive polyimide)

Figure 22:
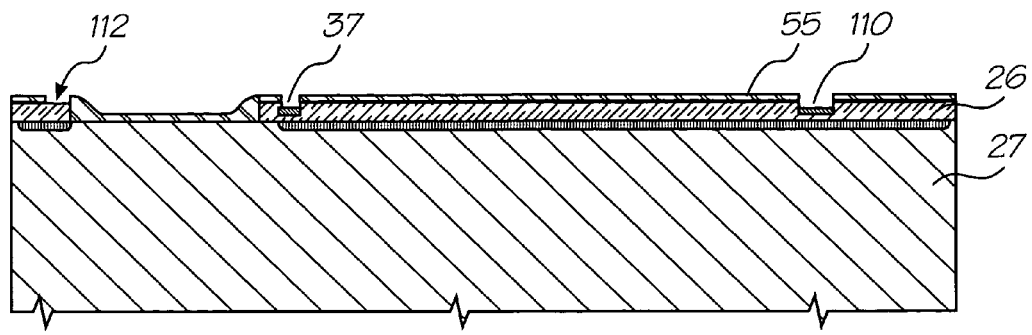

4. Etch (if aluminum) or develop (if photosensitive polyimide) the sacrificial layer using Mask 2. This mask defines the nozzle chamber walls 112 and the actuator anchor point. This step is shown in FIG. 22.

5. Deposit 1 micron of heater material 60 (e.g. cupronickel or TiN). If cupronickel, then deposition can consist of three steps—a thin anti-corrosion layer of, for example, TiN, followed by a seed layer, followed by electroplating of the 1 micron of cupronickel.

6. Deposit 3.4 microns of PECVD glass 61.

7. Deposit a layer 62 identical to step 5.

Figure 23:
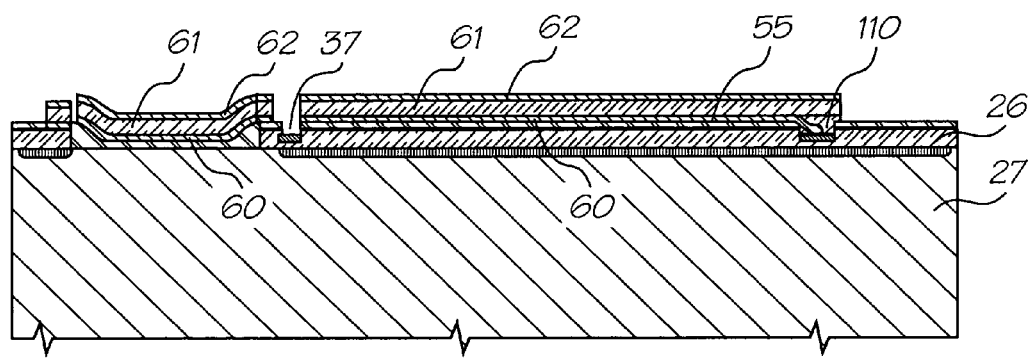

8. Etch both layers of heater material, and glass layer, using Mask 3. This mask defines the actuator, paddle, and nozzle chamber walls. This step is shown in FIG. 23.

9. Wafer probe. All electrical connections are complete at this point, bond pads are accessible, and the chips are not yet separated.

10. Deposit 10 microns of sacrificial material 70.

Figure 24:
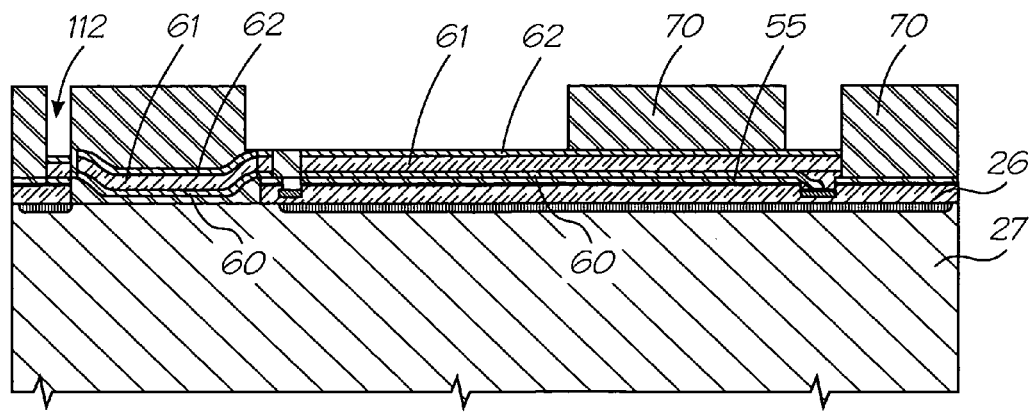

11. Etch or develop sacrificial material using Mask 4. This mask defines the nozzle chamber wall 112. This step is shown in FIG. 24.

12. Deposit 3 microns of PECVD glass 113.

Figure 25:
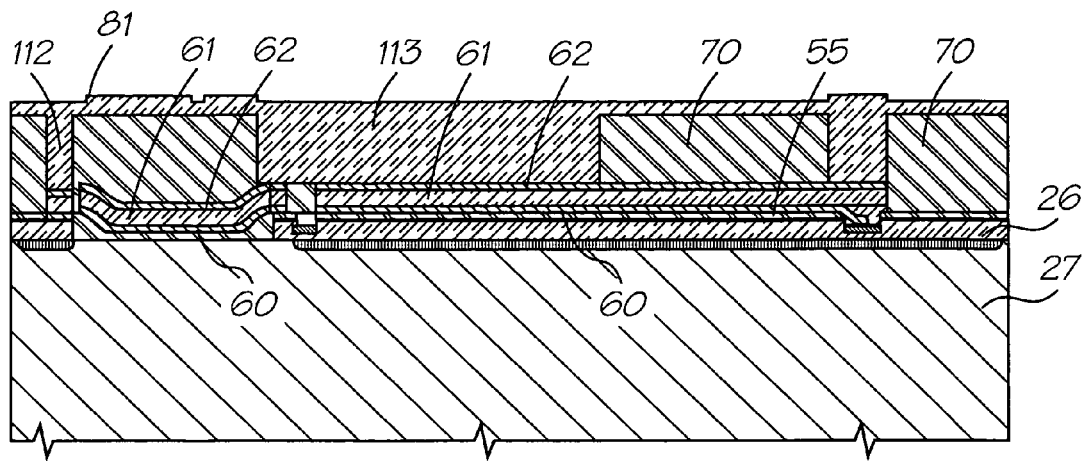

13. Etch to a depth of (approx.) 1 micron using Mask 5. This mask defines the nozzle rim 81. This step is shown in FIG. 25.

Figure 26:
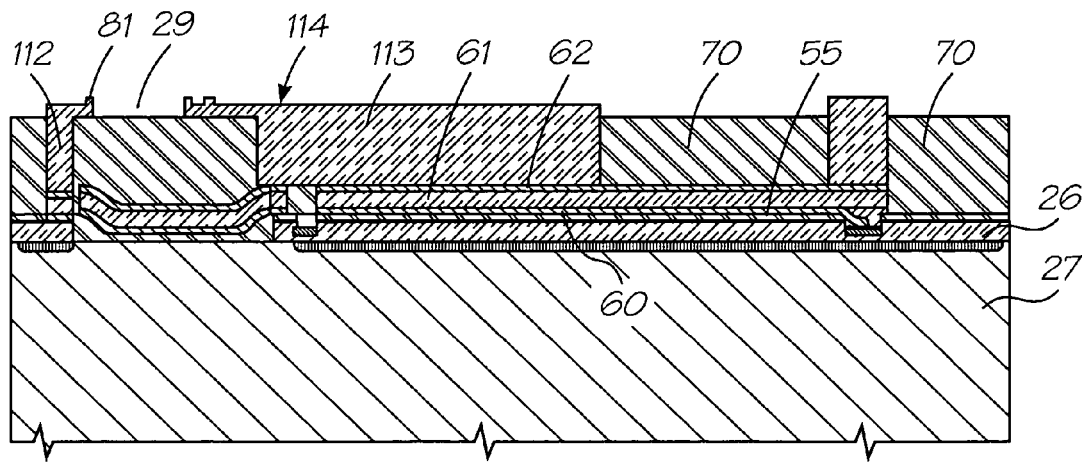

14. Etch down to the sacrificial layer using Mask 6. This mask defines the roof 114 of the nozzle chamber, and the nozzle itself. This step is shown in FIG. 26.

Figure 27:
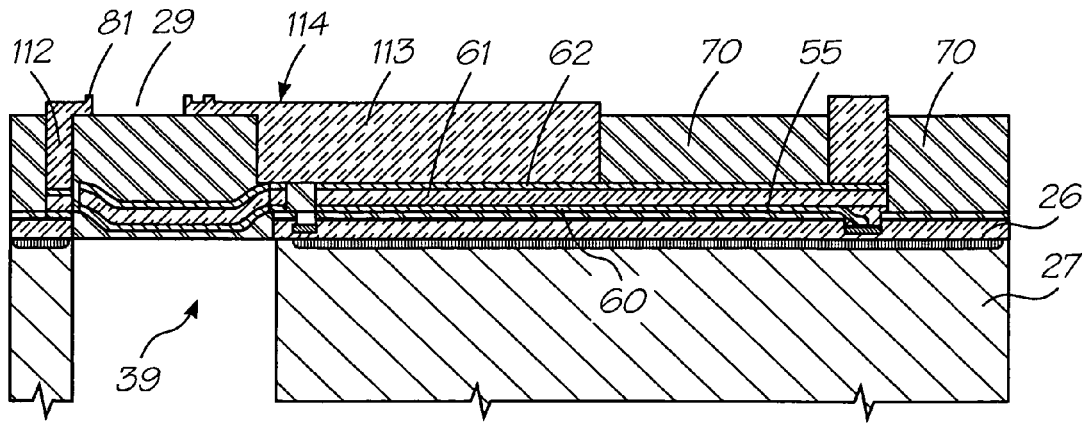

15. Back-etch completely through the silicon wafer (with, for example, an ASE Advanced Silicon Etcher from Surface Technology Systems) using Mask 7. This mask defines the ink inlets 30 which are etched through the wafer. The wafer is also diced by this etch. This step is shown in FIG. 27.

Figure 28:
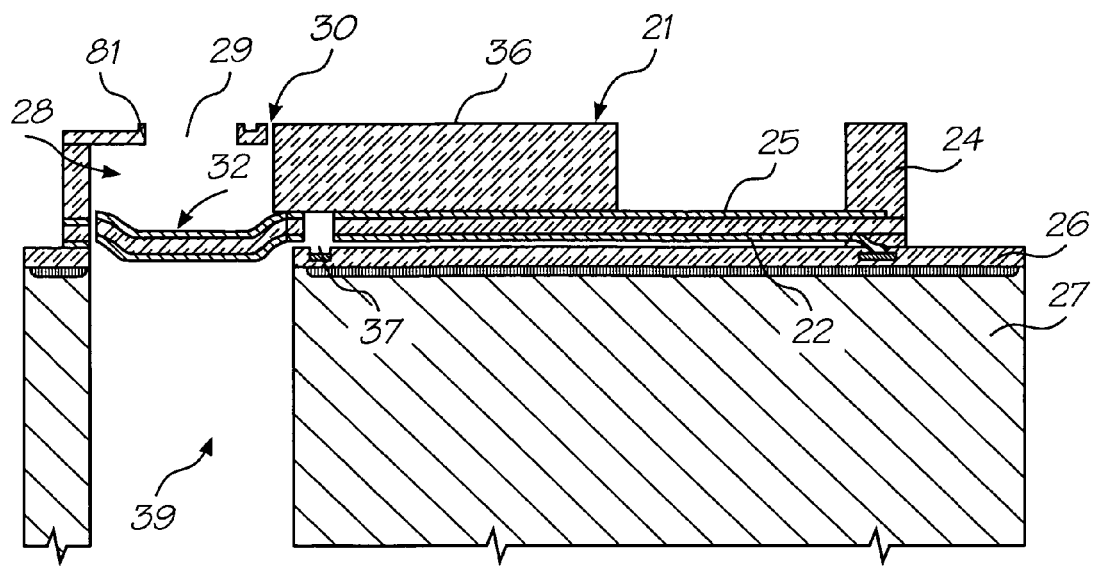

16. Etch the sacrificial material. The nozzle chambers are cleared, the actuators freed, and the chips are separated by this etch. This step is shown in FIG. 28.

17. Mount the printheads in their packaging, which may be a molded plastic former incorporating ink channels which supply the appropriate color ink to the ink inlets at the back of the wafer.

18. Connect the printheads to their interconnect systems. For a low profile connection with minimum disruption of airflow, TAB may be used. Wire bonding may also be used if the printer is to be operated with sufficient clearance to the paper.

19. Hydrophobize the front surface of the printheads.

Figure 29:
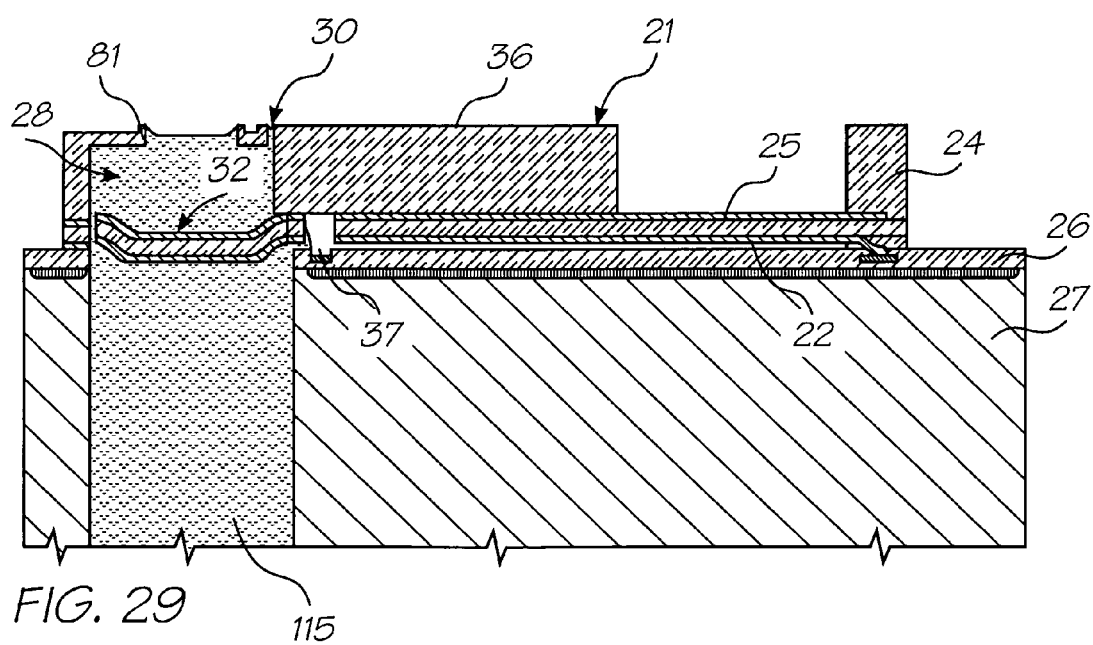

20. Fill the completed printheads with ink 115 and test them. A filled nozzle is shown in FIG. 29.

Figure 30:
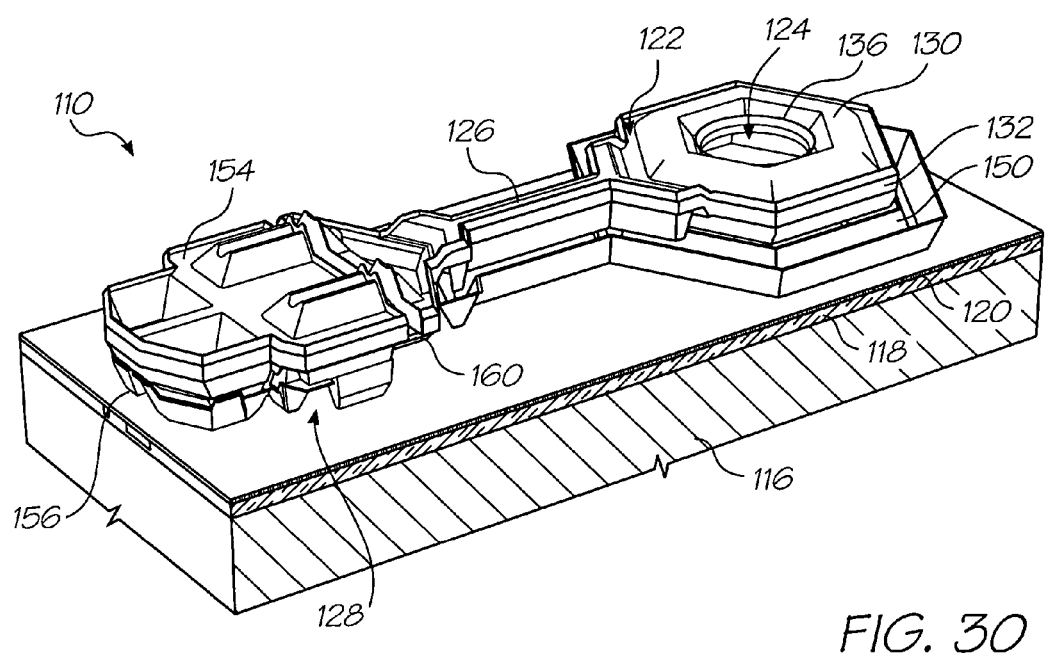
FIG. 30 shows a three dimensional, schematic view of a nozzle assembly for an ink jet printhead in accordance with another embodiment of the invention.

Referring now to FIG. 30 of the drawings, a nozzle assembly, in accordance with a further embodiment of the invention is designated generally by the reference numeral 110. An ink jet printhead has a plurality of nozzle assemblies 110 arranged in an array 114 (FIGS. 34 and 35) on a silicon substrate 116. The array 114 will be described in greater detail below.

The assembly 110 includes a silicon substrate or wafer 116 on which a dielectric layer 118 is deposited. A CMOS passivation layer 120 is deposited on the dielectric layer 118.

Each nozzle assembly 110 includes a nozzle 122 defining a nozzle opening 124, a connecting member in the form of a lever arm 126 and an actuator 128. The lever arm 126 connects the actuator 128 to the nozzle 122.

Figure 31:
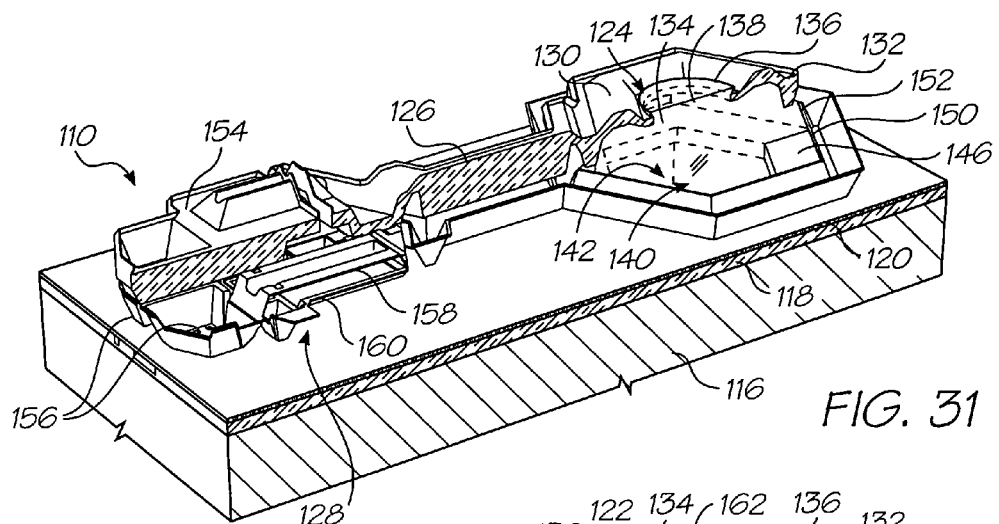
FIGS. 31 to 33 show a three dimensional, schematic illustration of an operation of the nozzle assembly of FIG. 30.
Figure 32:
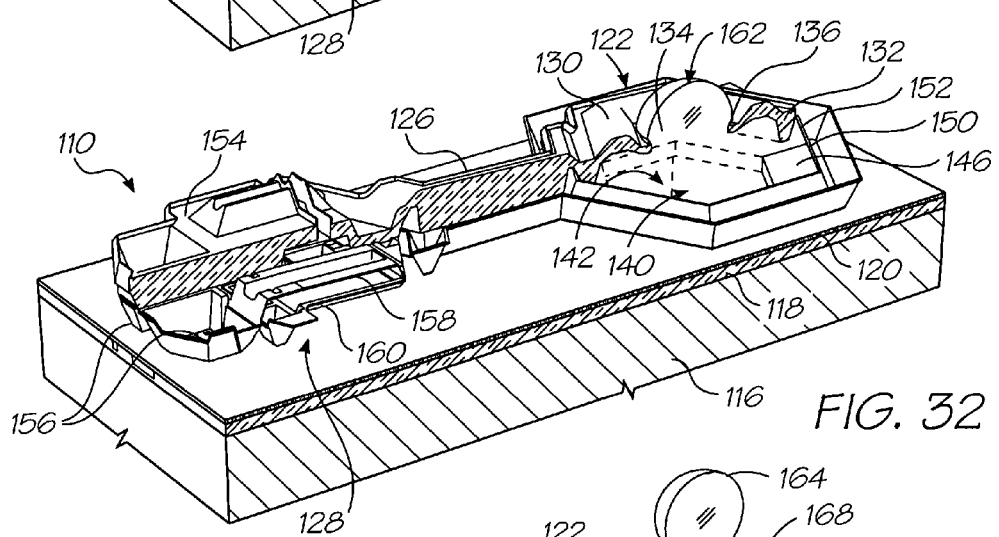
Figure 33:
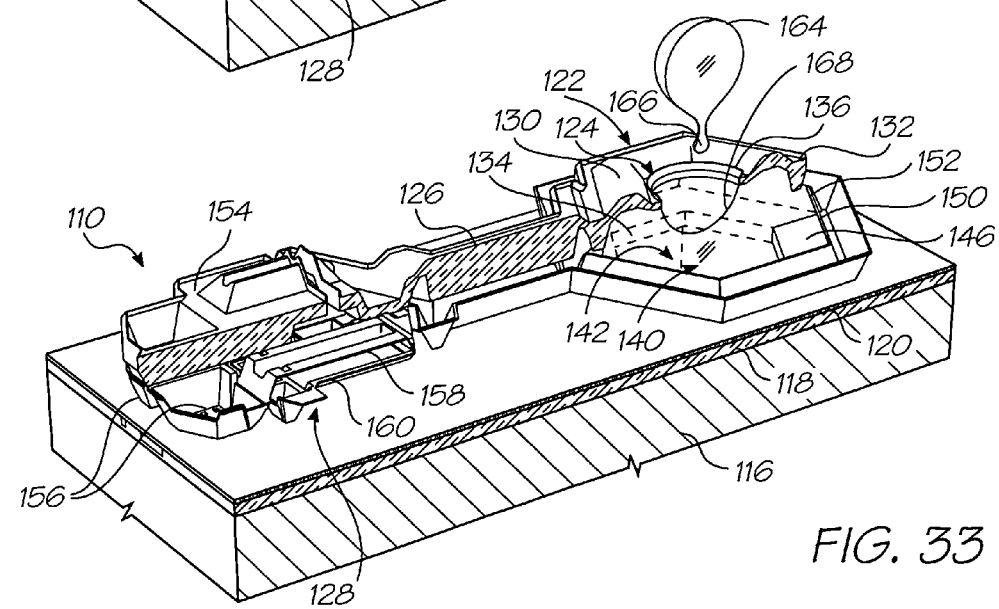

As shown in greater detail in FIGS. 31 to 33 of the drawings, the nozzle 122 comprises a crown portion 130 with a skirt portion 132 depending from the crown portion 130. The skirt portion 132 forms part of a peripheral wall of a nozzle chamber 134 (FIGS. 31 to 33 of the drawings). The nozzle opening 124 is in fluid communication with the nozzle chamber 134. It is to be noted that the nozzle opening 124 is surrounded by a raised rim 136 which "pins" a meniscus 138 (FIG. 31) of a body of ink 140 in the nozzle chamber 134.

An ink inlet aperture 142 (shown most clearly in FIG. 35 of the drawing) is defined in a floor 146 of the nozzle chamber 134. The aperture 142 is in fluid communication with an ink inlet channel 148 defined through the substrate 116.

A wall portion 150 bounds the aperture 142 and extends upwardly from the floor portion 146. The skirt portion 132, as indicated above, of the nozzle 122 defines a first part of a peripheral wall of the nozzle chamber 134 and the wall portion 150 defines a second part of the peripheral wall of the nozzle chamber 134.

The wall 150 has an inwardly directed lip 152 at its free end which serves as a fluidic seal which inhibits the escape of ink when the nozzle 122 is displaced, as will be described in greater detail below. It will be appreciated that, due to the viscosity of the ink 140 and the small dimensions of the spacing between the lip 152 and the skirt portion 132, the inwardly directed lip 152 and surface tension function as a seal for inhibiting the escape of ink from the nozzle chamber 134.

The actuator 128 is a thermal bend actuator and is connected to an anchor 154 extending upwardly from the substrate 116 or, more particularly, from the CMOS passivation layer 120. The anchor 154 is mounted on conductive pads 156 which form an electrical connection with the actuator 128.

The actuator 128 comprises an actuator arm in the form of a pair of active beams 158 arranged above a pair of passive beams 160. In a preferred embodiment, both beams 158 and 160 are of, or include, a conductive ceramic material such as titanium nitride (TiN).

The beams 158 and 160 have their first ends anchored to the anchor 154 and their opposed ends connected to the arm 126. When a current is caused to flow through the active beams 158 thermal expansion of the beams 158 results. As the passive beams 160, through which there is no current flow, do not expand at the same rate, a bending moment is created causing the arm 126 and, hence, the nozzle 122 to be displaced downwardly towards the substrate 116 as shown in FIG. 32 of the drawings. This causes an ejection of ink through the nozzle opening 124 as shown at 162 in FIG. 32 of the drawings. Thus, the nozzle 122 and the arm 126 define an ink ejecting mechanism. When the source of heat is removed from the active beams 158, i.e. by stopping current flow, the nozzle 122 returns to its quiescent position as shown in FIG. 33 of the drawings. When the nozzle 122 returns to its quiescent position, an ink droplet 164 is formed as a result of the breaking of an ink droplet neck as illustrated at 166 in FIG. 33 of the drawings. The ink droplet 164 then travels on to the print media such as a sheet of paper. As a result of the formation of the ink droplet 164, a "negative" meniscus is formed as shown at 168 in FIG. 33 of the drawings. This "negative" meniscus 168 results in an inflow of ink 140 into the nozzle chamber 134 such that a new meniscus 138 (FIG. 31) is formed in readiness for the next ink drop ejection from the nozzle assembly 110.

Each active beam 158 corresponds with one passive beam 160 to form two pairs of beams comprising an active beam 158 and a corresponding passive beam 160. Each active beam 158 is spaced from its corresponding passive beam 160 in a plane that is substantially parallel to the substrate. The spacing between each active beam 158 and its respective passive beam 160 is suitably between 1 percent and 20 percent of the length of the beams. Preferably the spacing is between 5 percent and 10 percent of the length of the beams. The Applicant has found that this configuration provides the best protection against mutual buckling while maintaining efficiency of operation. In particular, Applicant has found that if the spacing is less than 1 percent of the length of the beams there is an unacceptable risk of mutual buckling and if the spacing is greater than 20 percent of the length of the beams the efficiency of the actuators 128 is compromised.

Figure 34:
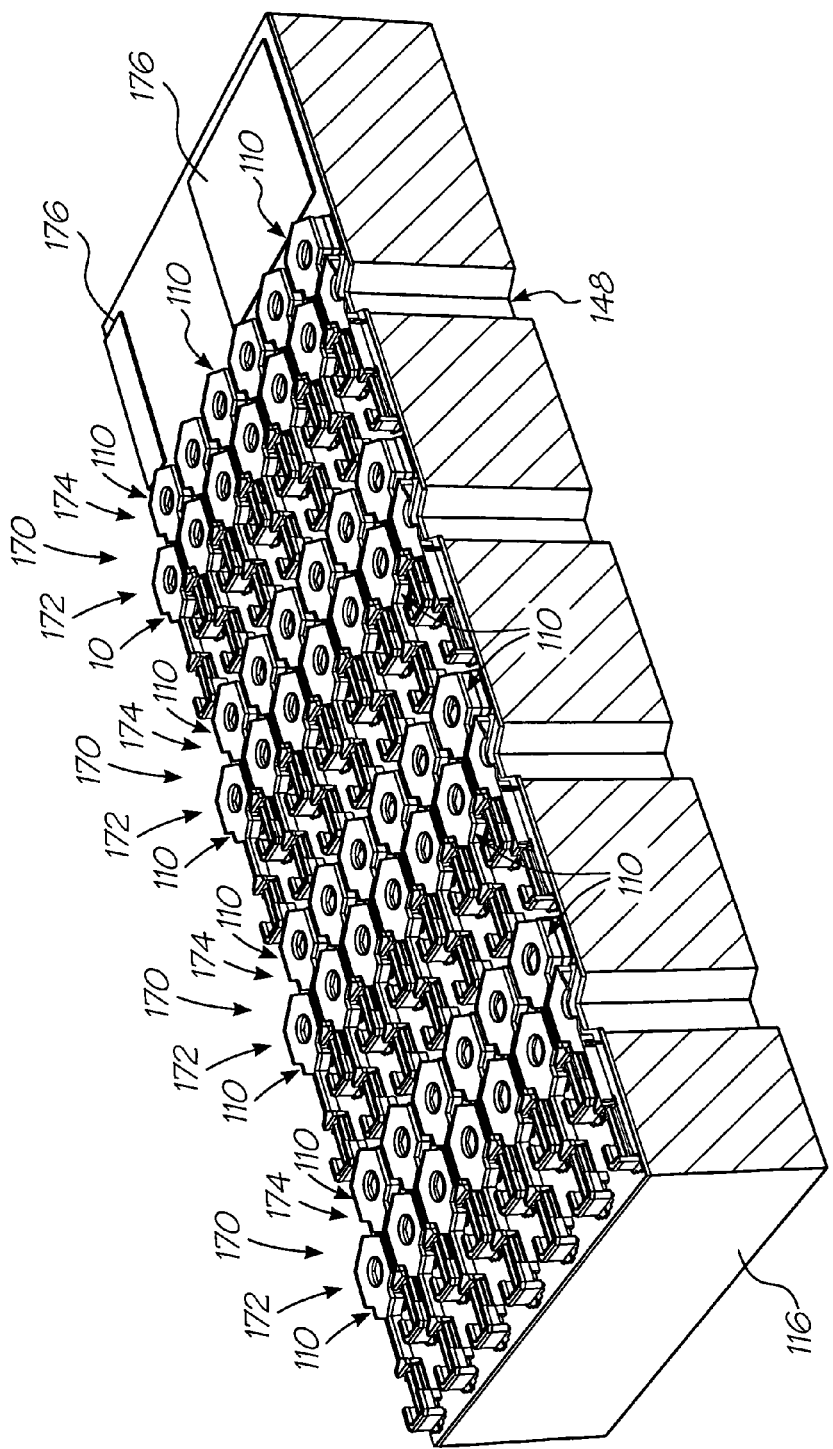
FIG. 34 shows a three dimensional view of a nozzle array constituting an ink jet printhead.
Figure 35:
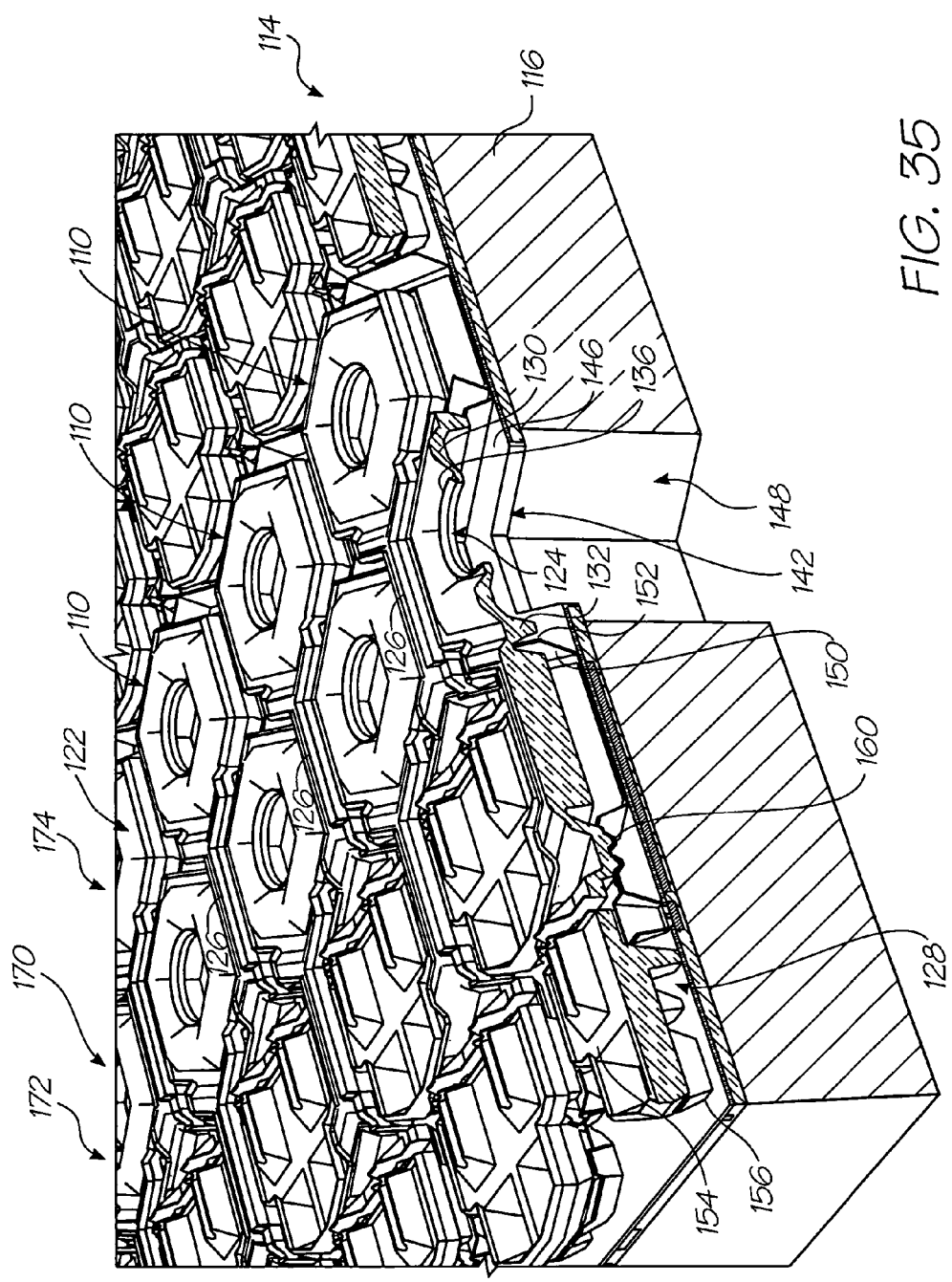
FIG. 35 shows, on an enlarged scale, part of the array of FIG. 34.

Referring now to FIGS. 34 and 35 of the drawings, the nozzle array 114 is described in greater detail. The array 114 is for a four-color printhead. Accordingly, the array 114 includes four groups 170 of nozzle assemblies, one for each color. Each group 170 has its nozzle assemblies 110 arranged in two rows 172 and 174. One of the groups 170 is shown in greater detail in FIG. 35 of the drawings.

To facilitate close packing of the nozzle assemblies 110 in the rows 172 and 174, the nozzle assemblies 110 in the row 174 are offset or staggered with respect to the nozzle assemblies 110 in the row 172. Also, the nozzle assemblies 110 in the row 172 are spaced apart sufficiently far from each other to enable the lever arms 126 of the nozzle assemblies 110 in the row 174 to pass between adjacent nozzles 122 of the assemblies 110 in the row 172. It is to be noted that each nozzle assembly 110 is substantially dumbbell shaped so that the nozzles 122 in the row 172 nest between the nozzles 122 and the actuators 128 of adjacent nozzle assemblies 110 in the row 174.

Further, to facilitate close packing of the nozzles 122 in the rows 172 and 174, each nozzle 122 is substantially hexagonally shaped.

It will be appreciated by those skilled in the art that, when the nozzles 122 are displaced towards the substrate 116, in use, due to the nozzle opening 124 being at a slight angle with respect to the nozzle chamber 134 ink is ejected slightly off the perpendicular. It is an advantage of the arrangement shown in FIGS. 34 and 35 of the drawings that the actuators 128 of the nozzle assemblies 110 in the rows 172 and 174 extend in the same direction to one side of the rows 172 and 174. Hence, the ink droplets ejected from the nozzles 122 in the row 172 and the ink droplets ejected from the nozzles 122 in the row 174 are parallel to one another resulting in an improved print quality.

Also, as shown in FIG. 34 of the drawings, the substrate 116 has bond pads 176 arranged thereon which provide the electrical connections, via the pads 156, to the actuators 128 of the nozzle assemblies 110. These electrical connections are formed via the CMOS layer (not shown).

Figure 36:
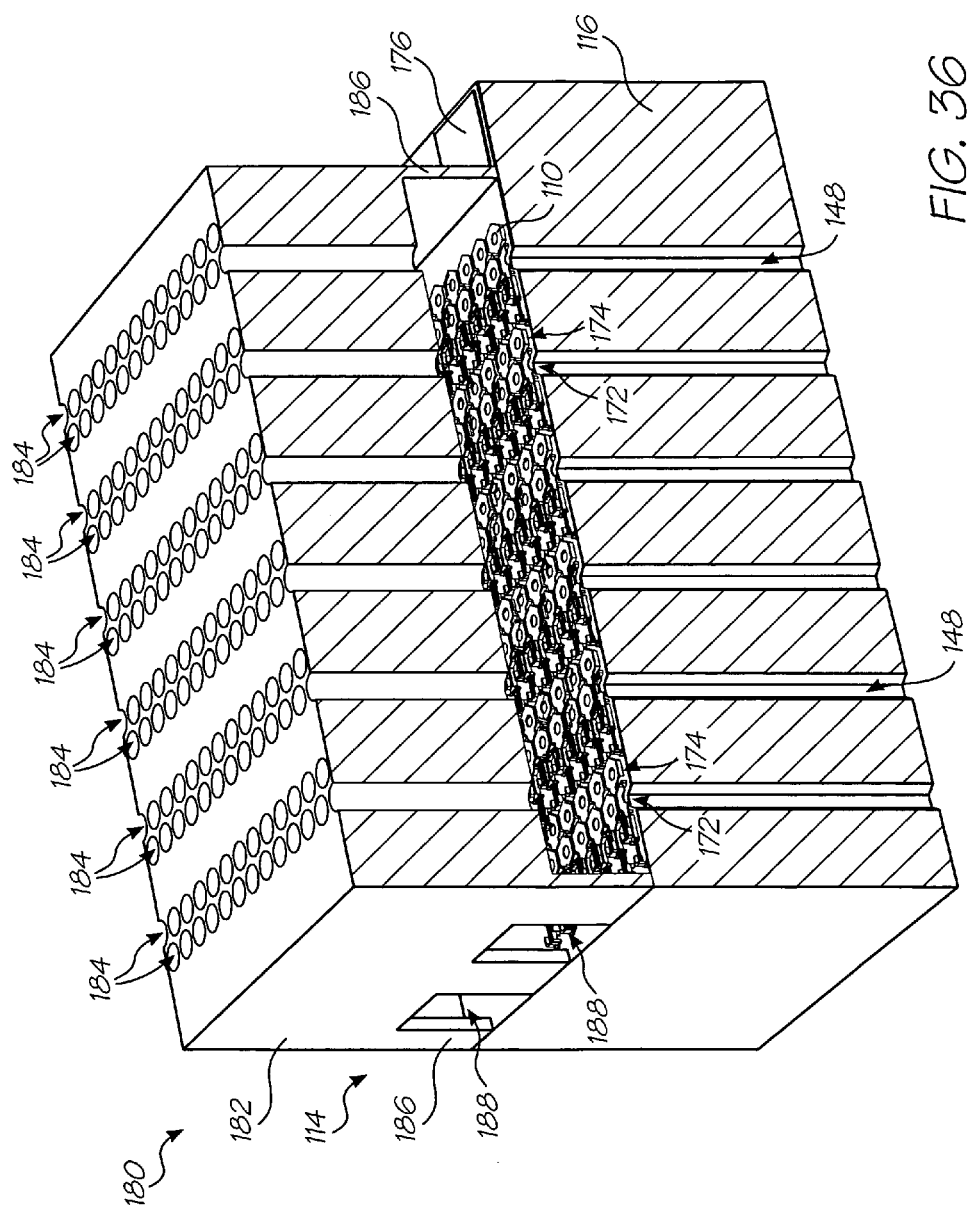
FIG. 36 shows a three dimensional view of an ink jet printhead including a nozzle guard.
Figure 38A:
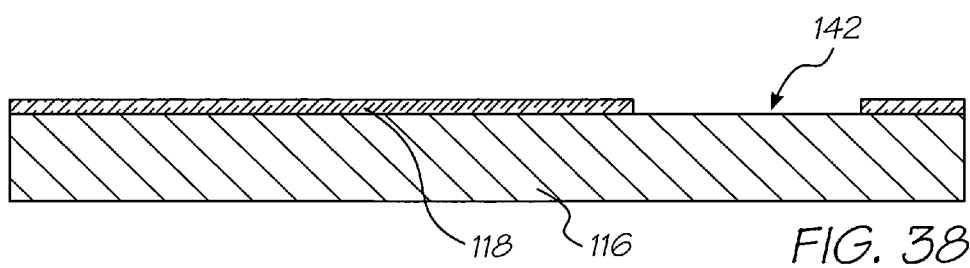
FIGS. 38a to 38r show sectional side views of the manufacturing steps.
Figure 39A:
FIGS. 39a to 39k show layouts of masks used in various steps in the manufacturing process.

Referring to FIG. 36 of the drawings, a development of the invention is shown. With reference to the previous drawings, like reference numerals refer to like parts, unless otherwise specified.

In this development, a nozzle guard 180 is mounted on the substrate 116 of the array 114. The nozzle guard 180 includes a body member 182 having a plurality of passages 184 defined therethrough. The passages 184 are in register with the nozzle openings 124 of the nozzle assemblies 110 of the array 114 such that, when ink is ejected from any one of the nozzle openings 124, the ink passes through the associated passage 184 before striking the print media.

The body member 182 is mounted in spaced relationship relative to the nozzle assemblies 110 by limbs or struts 186. One of the struts 186 has air inlet openings 188 defined therein.

In use, when the array 114 is in operation, air is charged through the inlet openings 188 to be forced through the passages 184 together with ink travelling through the passages 184.

The ink is not entrained in the air as the air is charged through the passages 184 at a different velocity from that of the ink droplets 164. For example, the ink droplets 164 are ejected from the nozzles 122 at a velocity of approximately 3 m/s. The air is charged through the passages 184 at a velocity of approximately 1 m/s.

The purpose of the air is to maintain the passages 184 clear of foreign particles. A danger exists that these foreign particles, such as dust particles, could fall onto the nozzle assemblies 110 adversely affecting their operation. With the provision of the air inlet openings 88 in the nozzle guard 180 this problem is, to a large extent, obviated.

Referring now to FIGS. 37 to 39 of the drawings, a process for manufacturing the nozzle assemblies 110 is described.

Starting with the silicon substrate or wafer 116, the dielectric layer 118 is deposited on a surface of the wafer 116. The dielectric layer 118 is in the form of approximately 1.5 microns of CVD oxide. Resist is spun on to the layer 118 and the layer 118 is exposed to mask 200 and is subsequently developed.

After being developed, the layer 118 is plasma etched down to the silicon layer 116. The resist is then stripped and the layer 118 is cleaned. This step defines the ink inlet aperture 142.

Figure 37A:
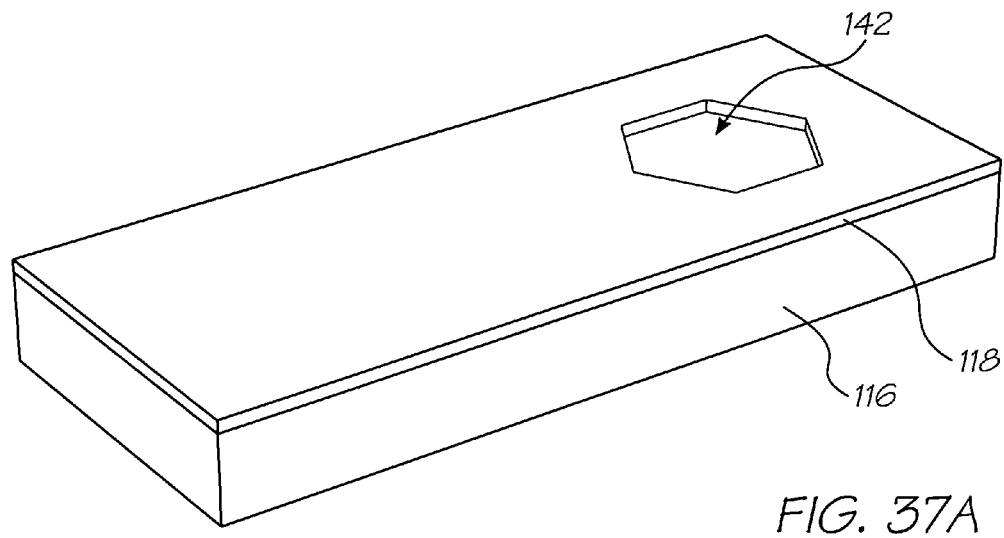
FIGS. 37a to 37r show three-dimensional views of steps in the manufacture of a nozzle assembly of an ink jet printhead.
Figure 37B:
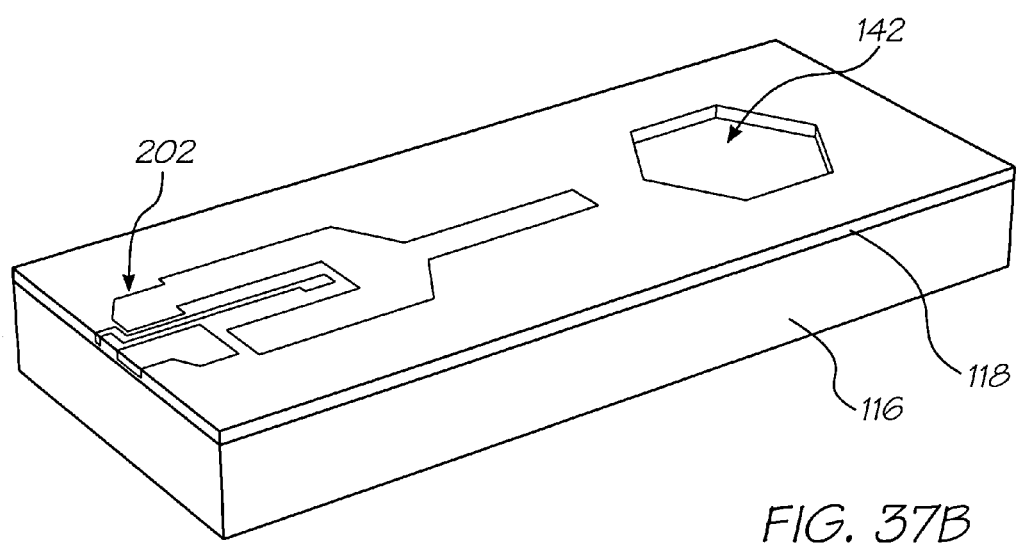
Figure 38B:
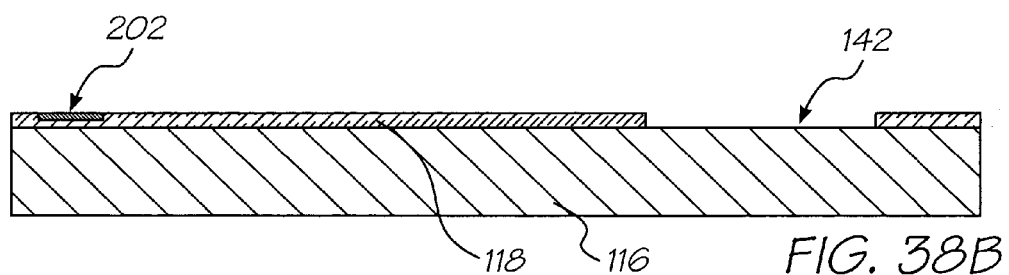
Figure 39B:
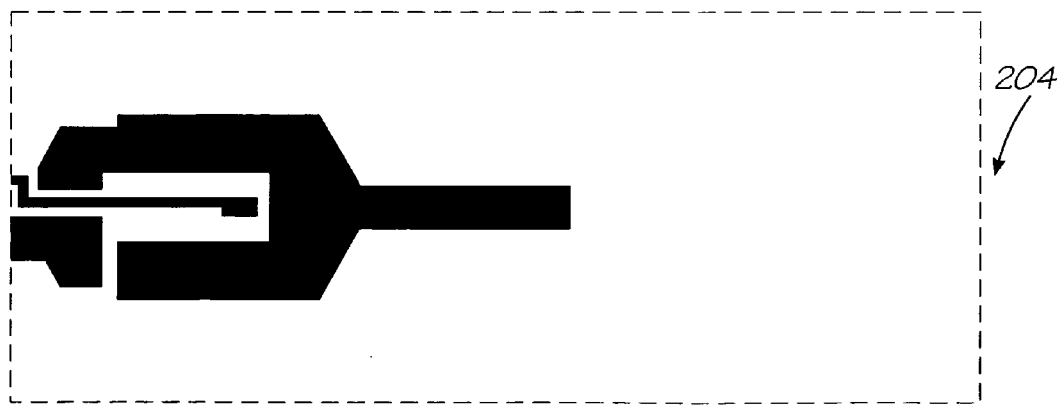
Figure 37C:
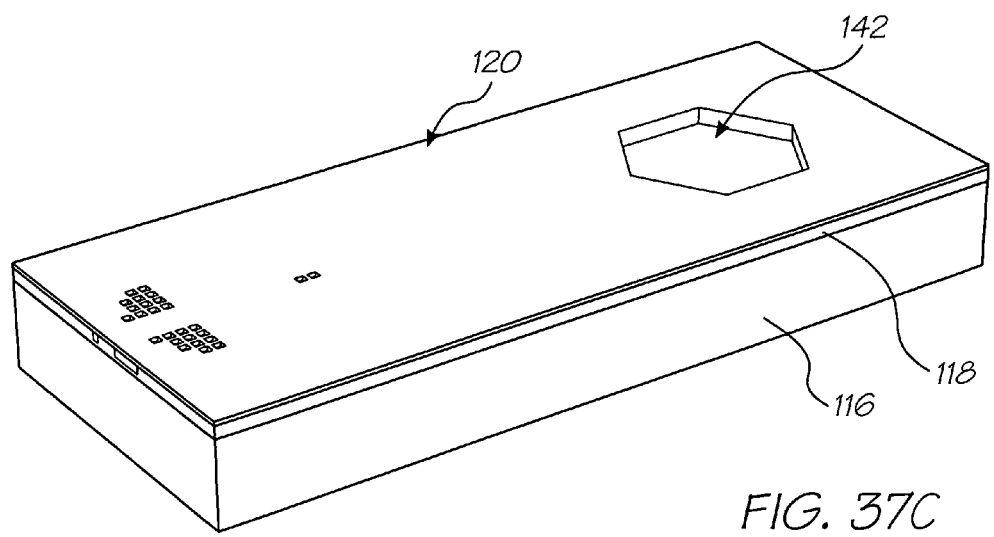
Figure 38C:
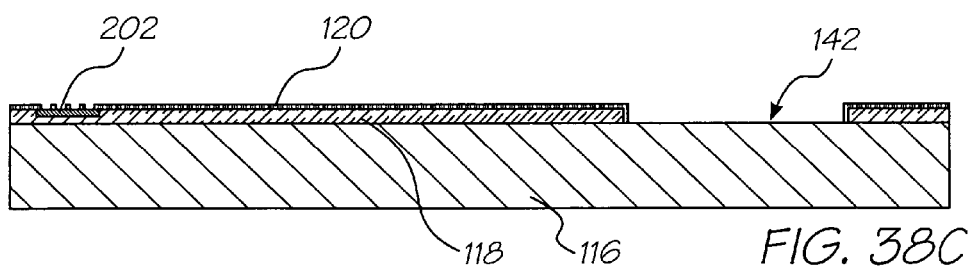
Figure 39C:
Figure 37D:
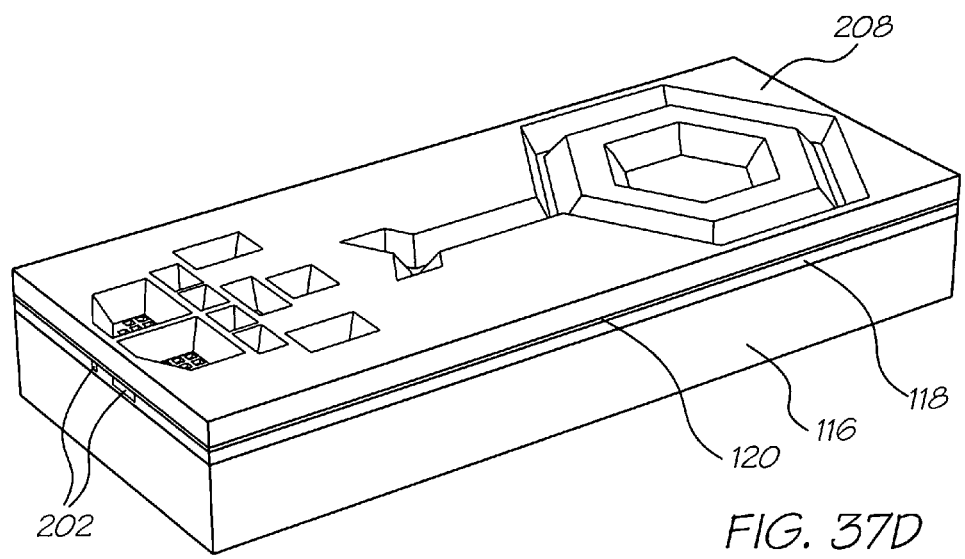
Figure 38D:
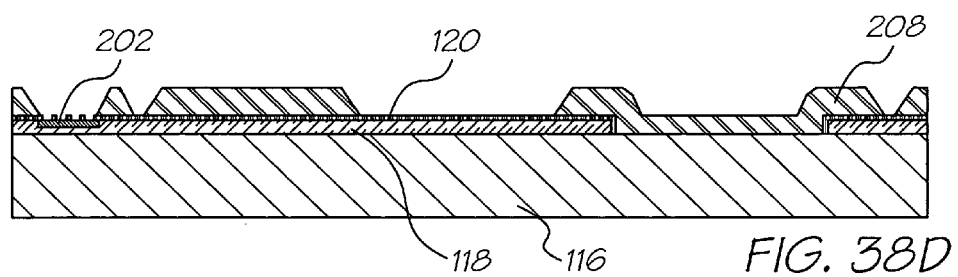
Figure 39D:
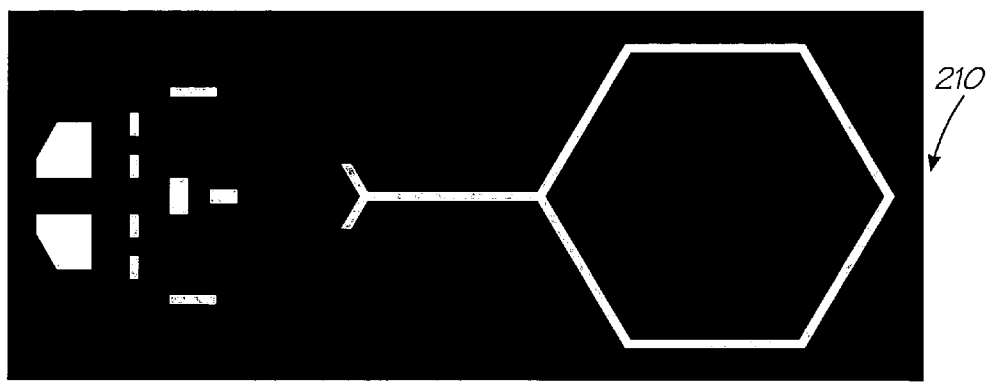

In FIG. 37*b* of the drawings, approximately 0.8 microns of aluminum 202 is deposited on the layer 118. Resist is spun on and the aluminum 202 is exposed to mask 204 and developed. The aluminum 202 is plasma etched down to the oxide layer 118, the resist is stripped and the device is cleaned. This step provides the bond pads and interconnects to the ink jet actuator 128. This interconnect is to an NMOS drive transistor and a power plane with connections made in the CMOS layer (not shown).

Approximately 0.5 microns of PECVD nitride is deposited as the CMOS passivation layer 120. Resist is spun on and the layer 120 is exposed to mask 206 whereafter it is developed. After development, the nitride is plasma etched down to the aluminum layer 202 and the silicon layer 116 in the region of the inlet aperture 142. The resist is stripped and the device cleaned.

A layer 208 of a sacrificial material is spun on to the layer 120. The layer 208 is 6 microns of photo-sensitive polyimide or approximately 4 µm of high temperature resist. The layer 208 is softbaked and is then exposed to mask 210 whereafter it is developed. The layer 208 is then hardbaked at 400° C. for one hour where the layer 208 is comprised of polyimide or at greater than 300° C. where the layer 208 is high temperature resist. It is to be noted in the drawings that the pattern-dependent distortion of the polyimide layer 208 caused by shrinkage is taken into account in the design of the mask 210.

Figure 37E:
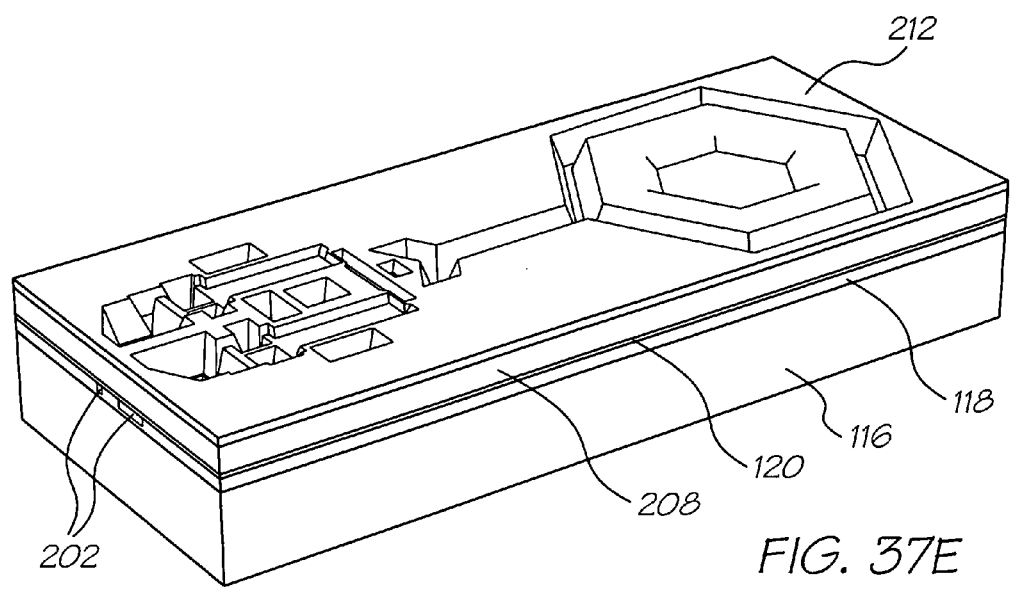
Figure 38E:
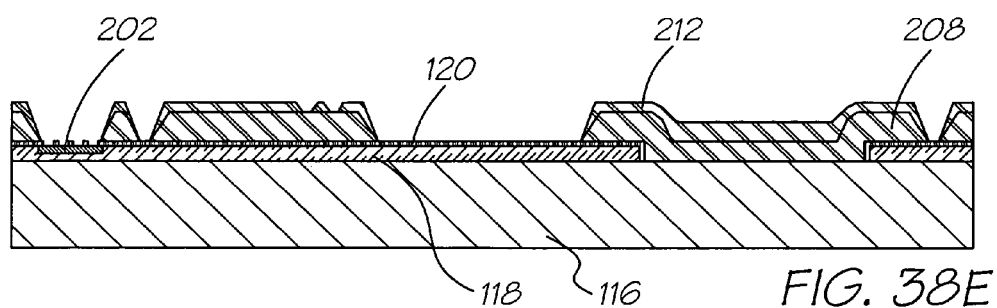
Figure 39E:
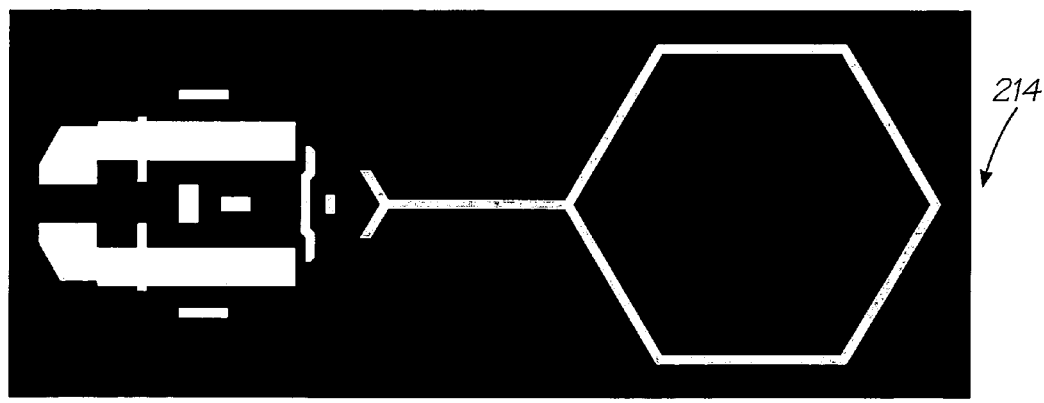
Figure 37F:
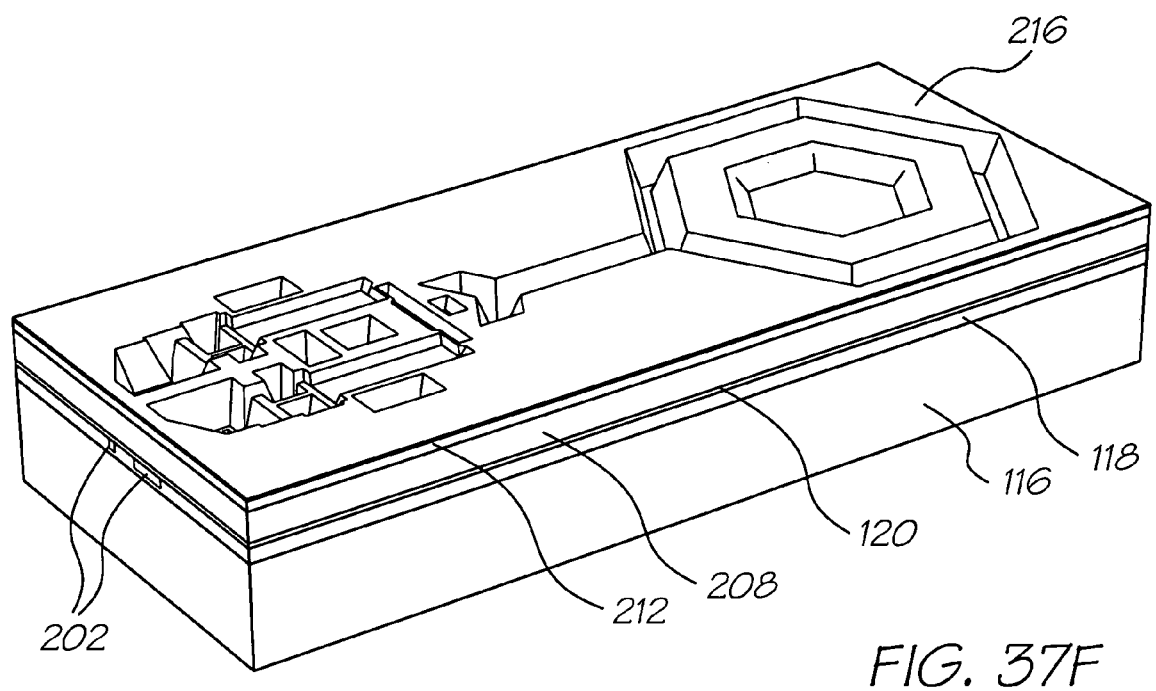
Figure 38F:
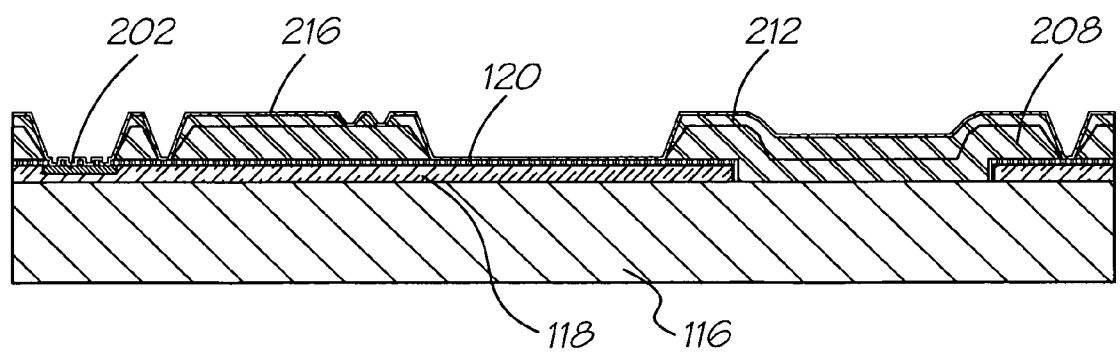
Figure 37G:
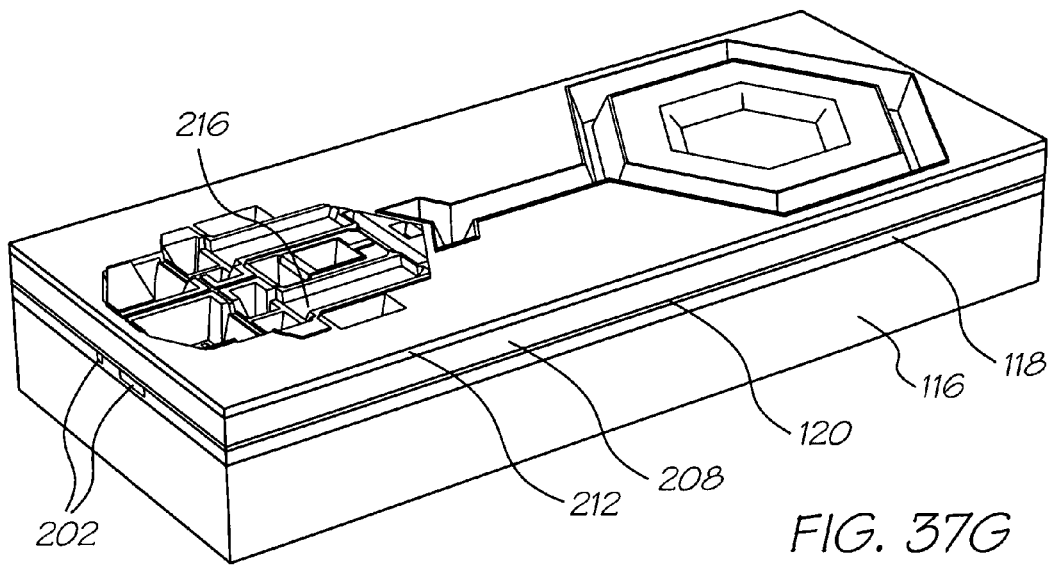
Figure 38G:
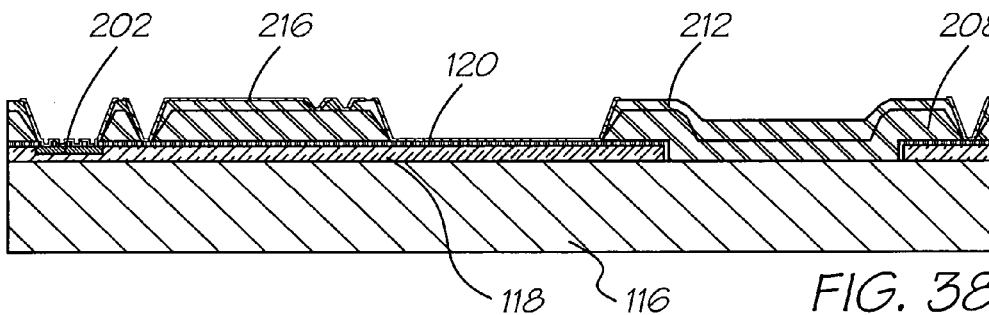
Figure 39F:
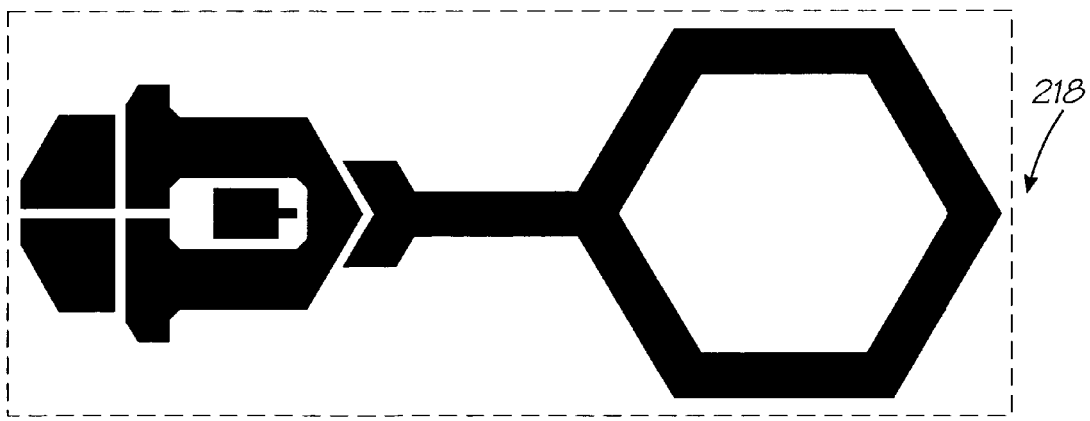
Figure 37H:
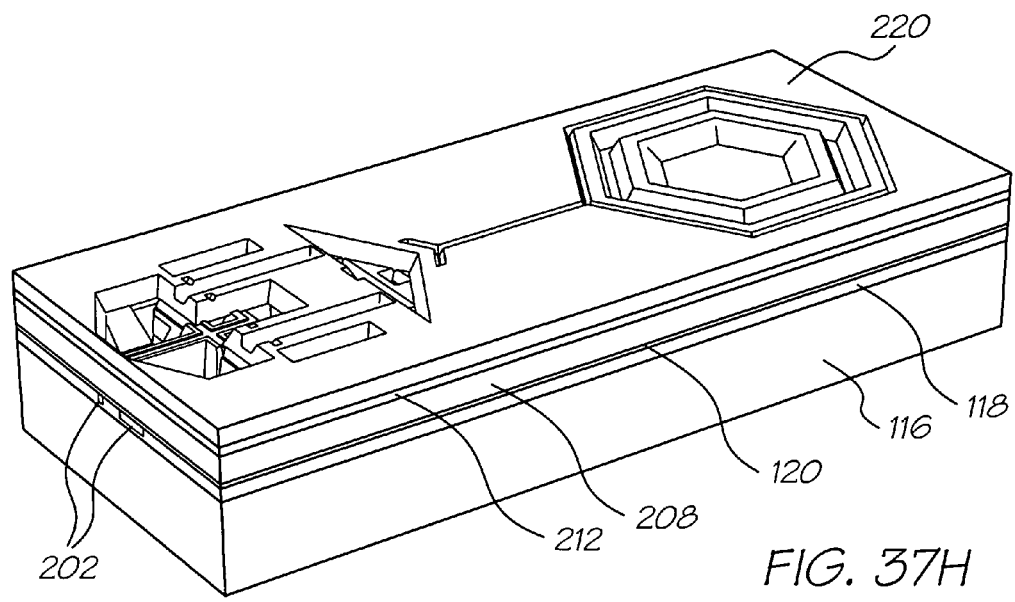
Figure 38H:
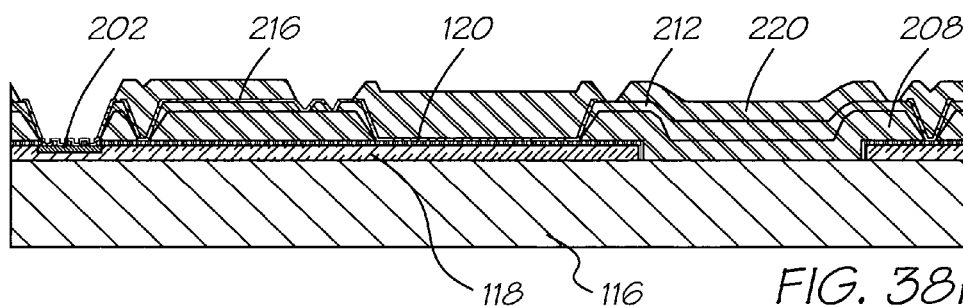
Figure 39G:
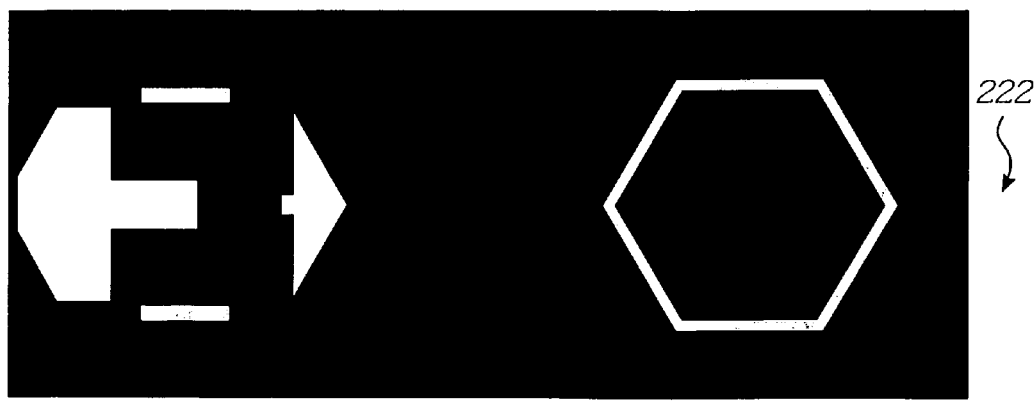
Figure 37I:
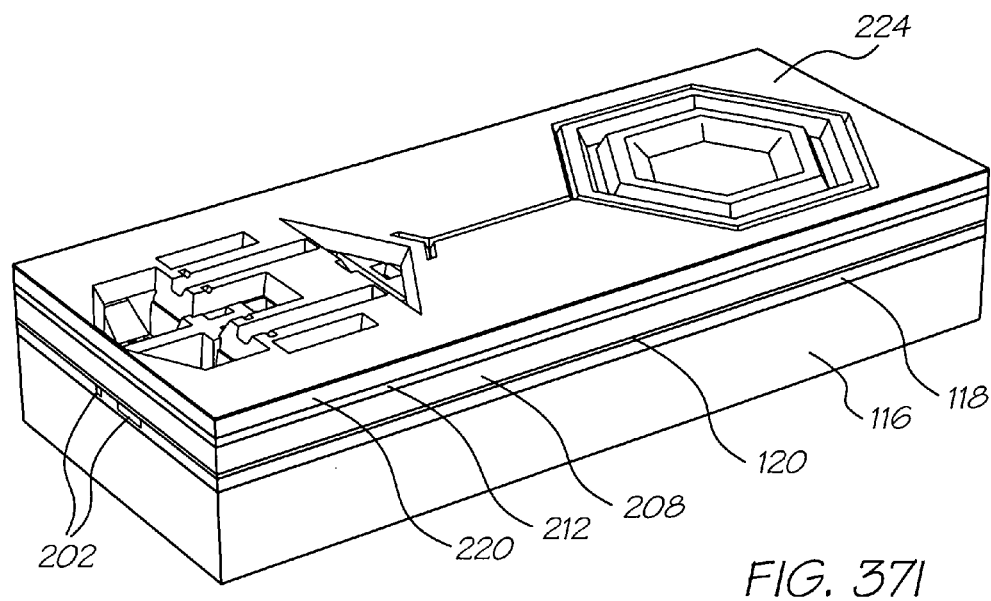
Figure 38I:
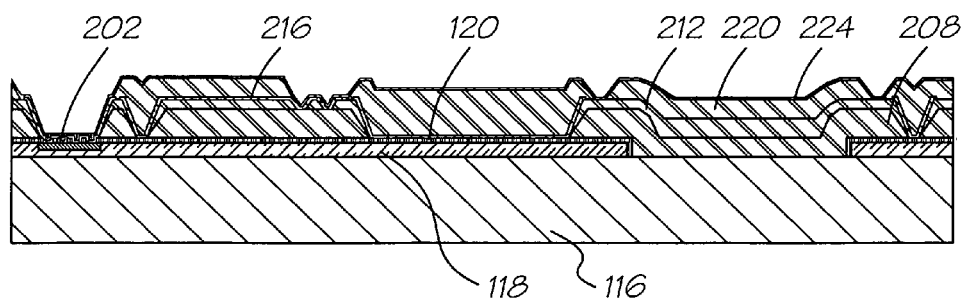
Figure 37J:
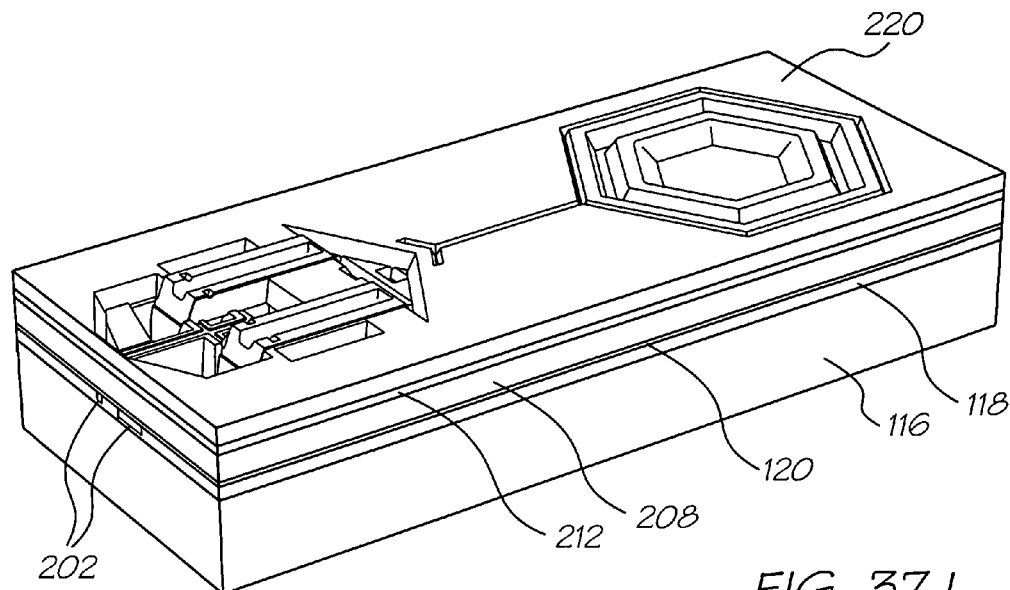
Figure 38J:
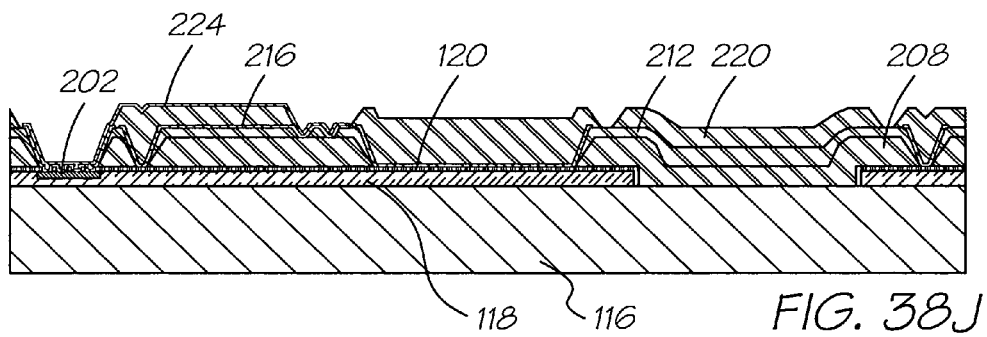
Figure 39H:
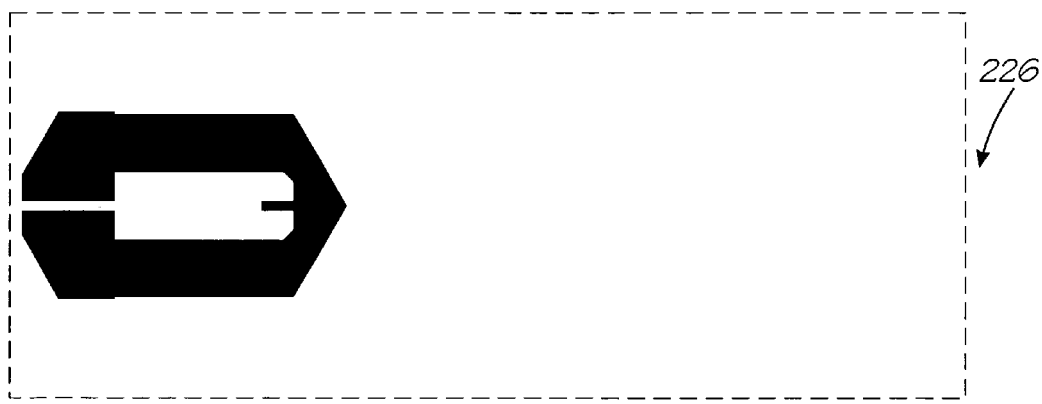
Figure 37K:
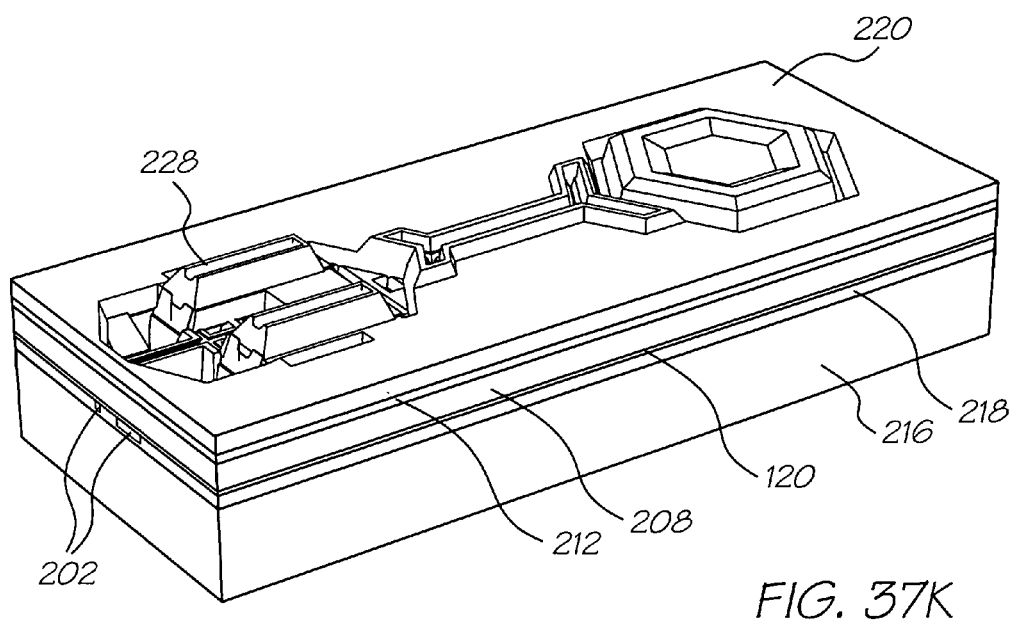
Figure 38K:
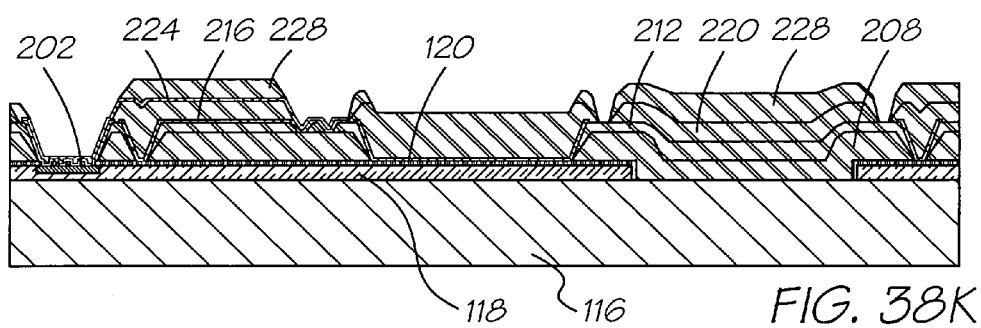
Figure 39I:
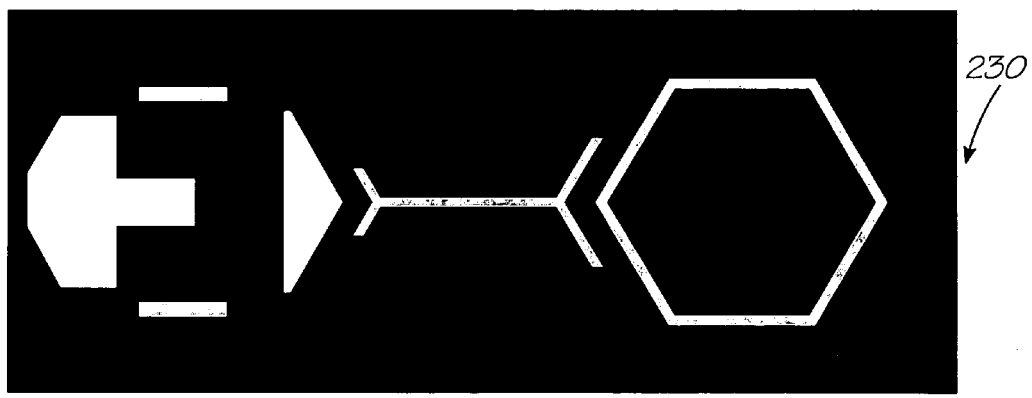

In the next step, shown in FIG. 37e of the drawings, a second sacrificial layer 212 is applied. The layer 212 is either 2 µm of photosensitive polyimide, which is spun on, or approximately 1.3 µm of high temperature resist. The layer 212 is softbaked and exposed to mask 214. After exposure to the mask 214, the layer 212 is developed. In the case of the layer 212 being polyimide, the layer 212 is hardbaked at 400° C. for approximately one hour. Where the layer 212 is resist, it is hardbaked at greater than 300° C. for approximately one hour.

A 0.2 micron multi-layer metal layer 216 is then deposited. Part of this layer 216 forms the passive beam 160 of the actuator 128.

The layer 216 is formed by sputtering 1,000 Å of titanium nitride (TiN) at around 300° C. followed by sputtering 50 Å of tantalum nitride (TaN). A further 1,000 Å of TiN is sputtered on followed by 50 Å of TaN and a further 1,000 Å of TiN.

Other materials which can be used instead of TiN are $TiB_2$, $MoSi_2$ or (Ti, Al)N.

The layer 216 is then exposed to mask 218, developed and plasma etched down to the layer 212 whereafter resist, applied for the layer 216, is wet stripped taking care not to remove the cured layers 208 or 212.

A third sacrificial layer 220 is applied by spinning on 4 µm of photosensitive polyimide or approximately 2.6 µm high temperature resist. The layer 220 is softbaked whereafter it is exposed to mask 222. The exposed layer is then developed followed by hardbaking. In the case of polyimide, the layer 220 is hardbaked at 400° C. for approximately one hour or at greater than 300° C. where the layer 220 comprises resist.

A second multi-layer metal layer 224 is applied to the layer 220. The constituents of the layer 224 are the same as the layer 216 and are applied in the same manner. It will be appreciated that both layers 216 and 224 are electrically conductive layers.

The layer 224 is exposed to mask 226 and is then developed. The layer 224 is plasma etched down to the polyimide or resist layer 220 whereafter resist applied for the layer 224 is wet stripped taking care not to remove the cured layers 208, 212 or 220. It will be noted that the remaining part of the layer 224 defines the active beam 158 of the actuator 128.

A fourth sacrificial layer 228 is applied by spinning on 4 µm of photosensitive polyimide or approximately 2.6 µm of high temperature resist. The layer 228 is softbaked, exposed to the mask 230 and is then developed to leave the island portions as shown in FIG. 9k of the drawings. The remaining portions of the layer 228 are hardbaked at 400° C. for approximately one hour in the case of polyimide or at greater than 300° C. for resist.

Figure 37L:
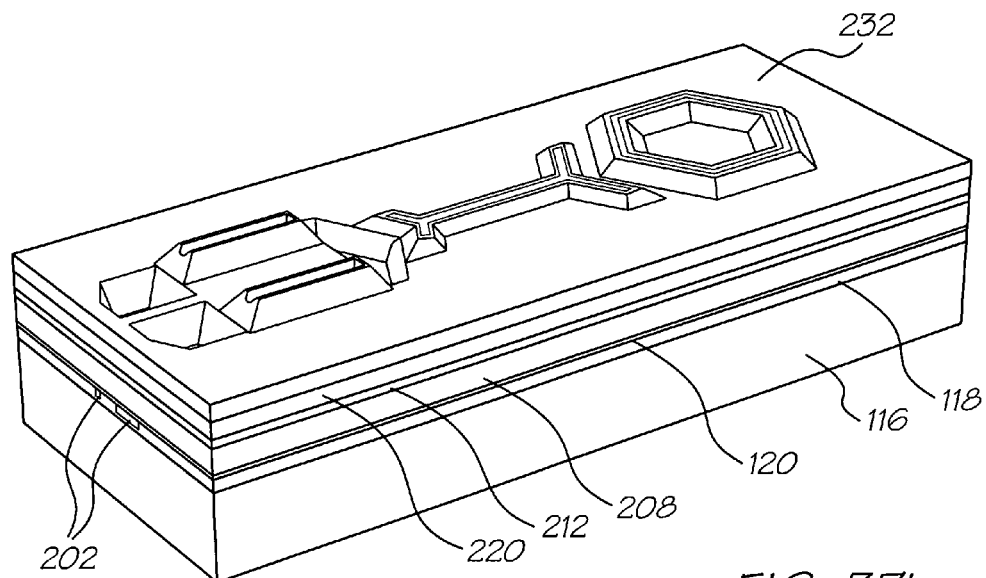
Figure 38L:
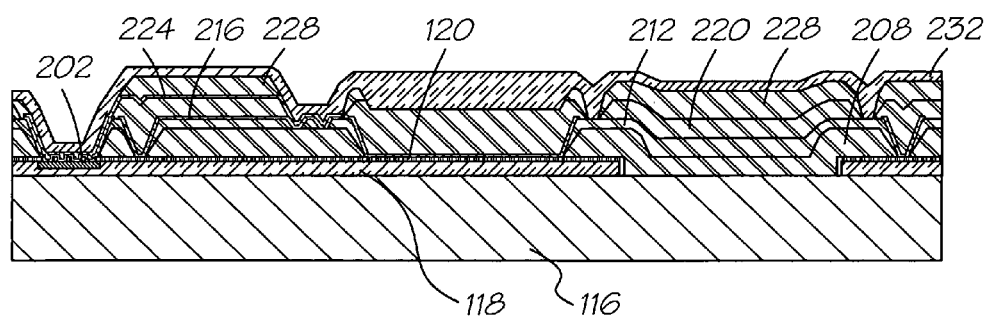
Figure 37M:
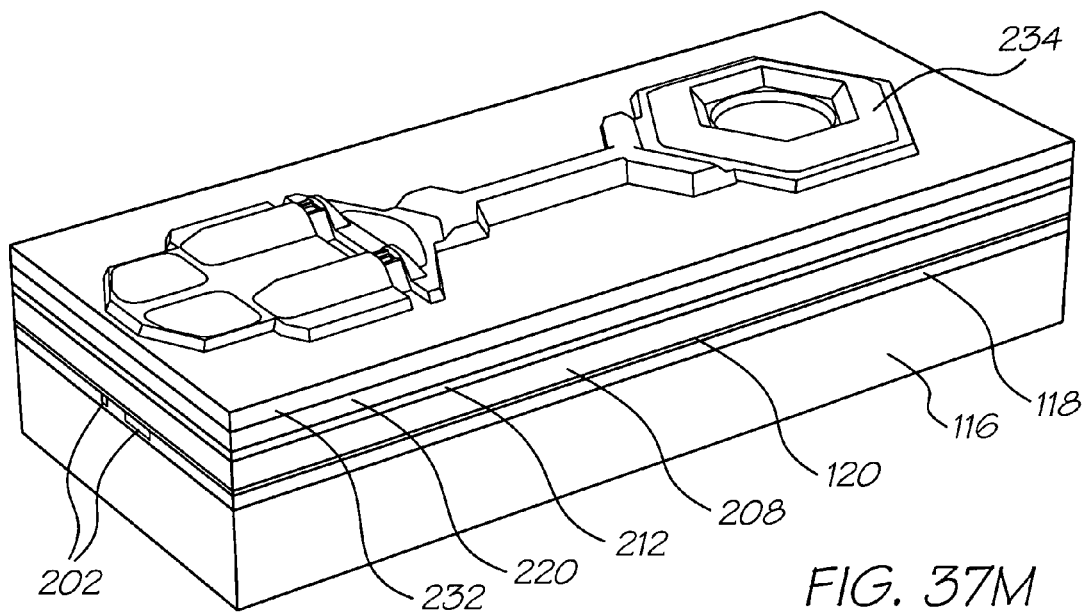
Figure 38M:
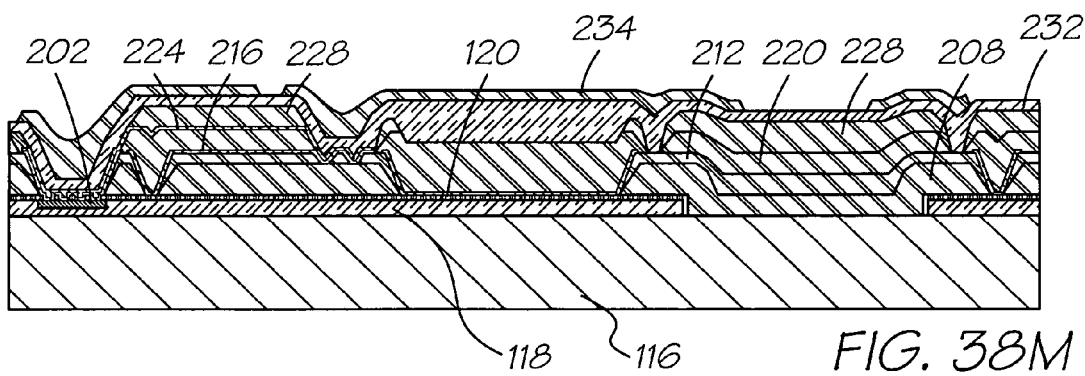
Figure 39J:
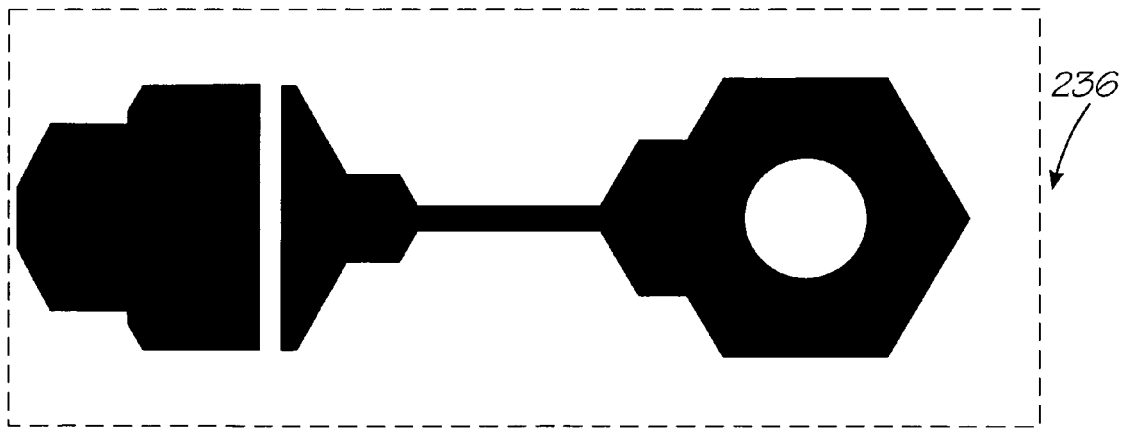
Figure 37N:
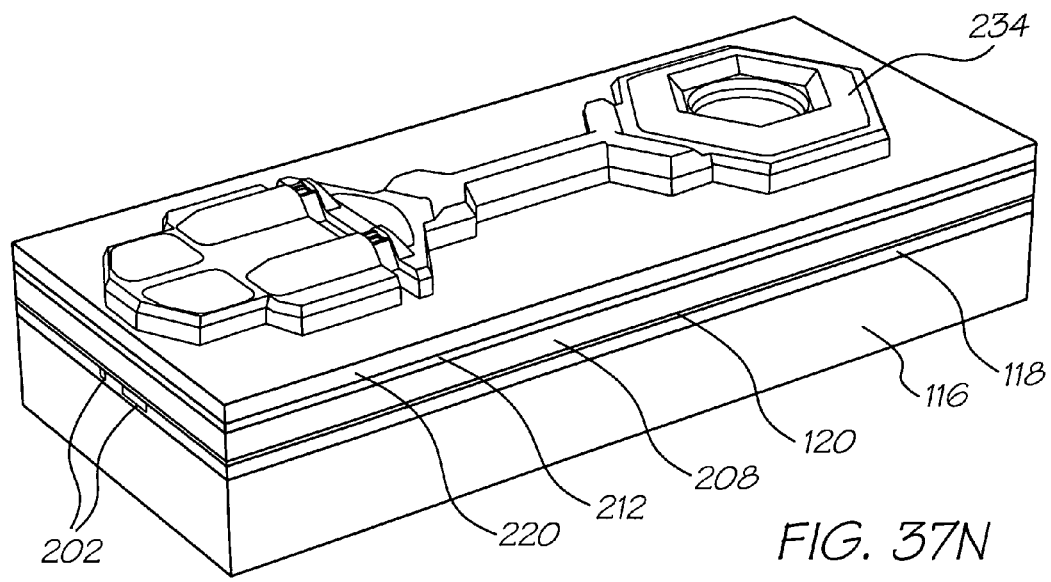
Figure 38N:
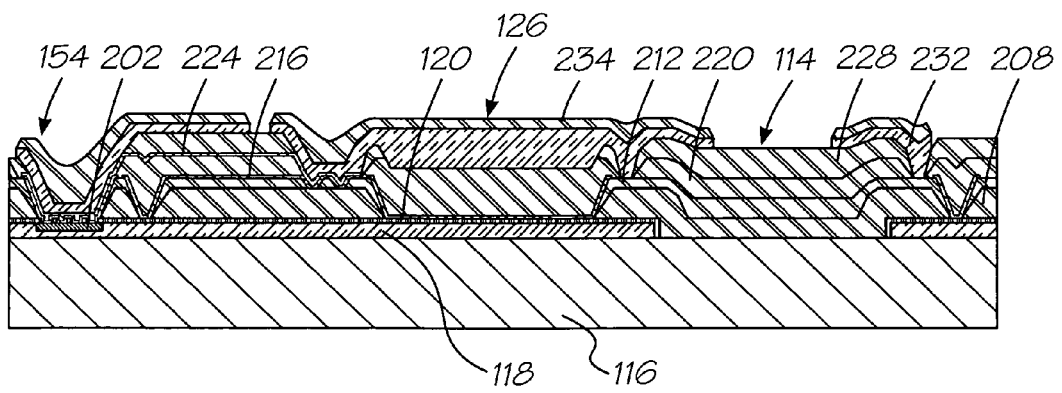
Figure 370:
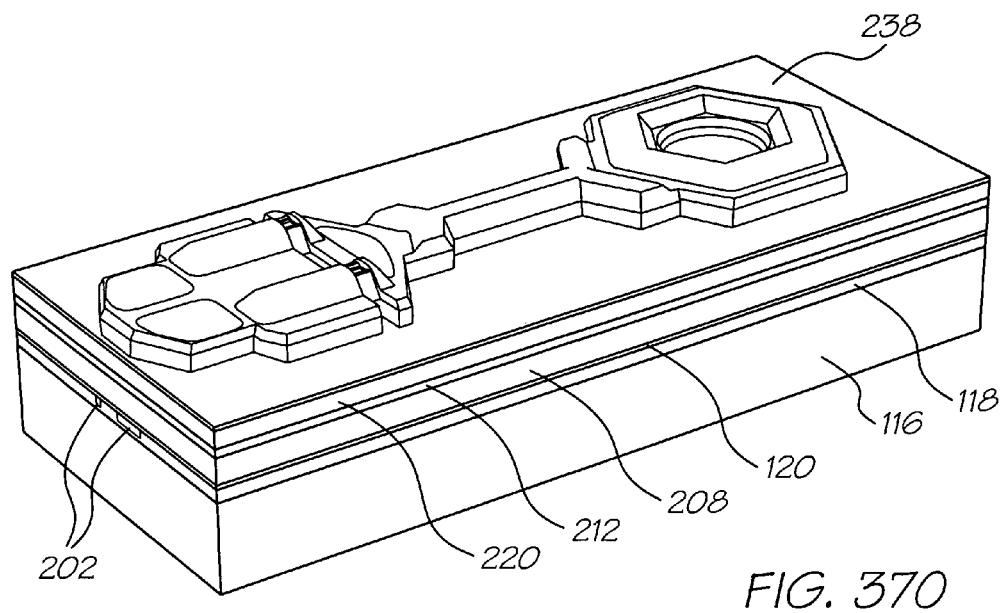
Figure 380:
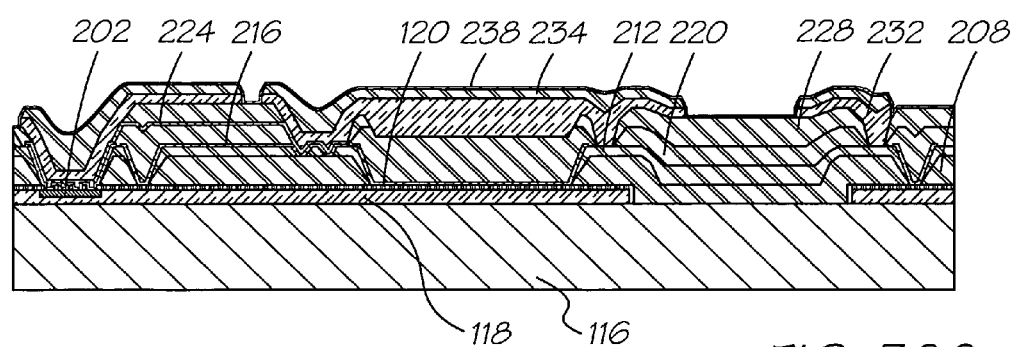

As shown in FIG. 37l of the drawing a high Young's modulus dielectric layer 232 is deposited. The layer 232 is constituted by approximately 1 µm of silicon nitride or aluminum oxide. The layer 232 is deposited at a temperature below the hardbaked temperature of the sacrificial layers 208, 212, 220, 228. The primary characteristics required for this dielectric layer 232 are a high elastic modulus, chemical inertness and good adhesion to TiN.

A fifth sacrificial layer 234 is applied by spinning on 2 µm of photosensitive polyimide or approximately 1.3 µm of high temperature resist. The layer 234 is softbaked, exposed to mask 236 and developed. The remaining portion of the layer 234 is then hardbaked at 400° C. for one hour in the case of the polyimide or at greater than 300° C. for the resist.

The dielectric layer 232 is plasma etched down to the sacrificial layer 228 taking care not to remove any of the sacrificial layer 234.

This step defines the nozzle opening 124, the lever arm 126 and the anchor 154 of the nozzle assembly 110.

A high Young's modulus dielectric layer 238 is deposited. This layer 238 is formed by depositing 0.2 µm of silicon nitride or aluminum nitride at a temperature below the hardbaked temperature of the sacrificial layers 208, 212, 220 and 228.

Figure 37P:
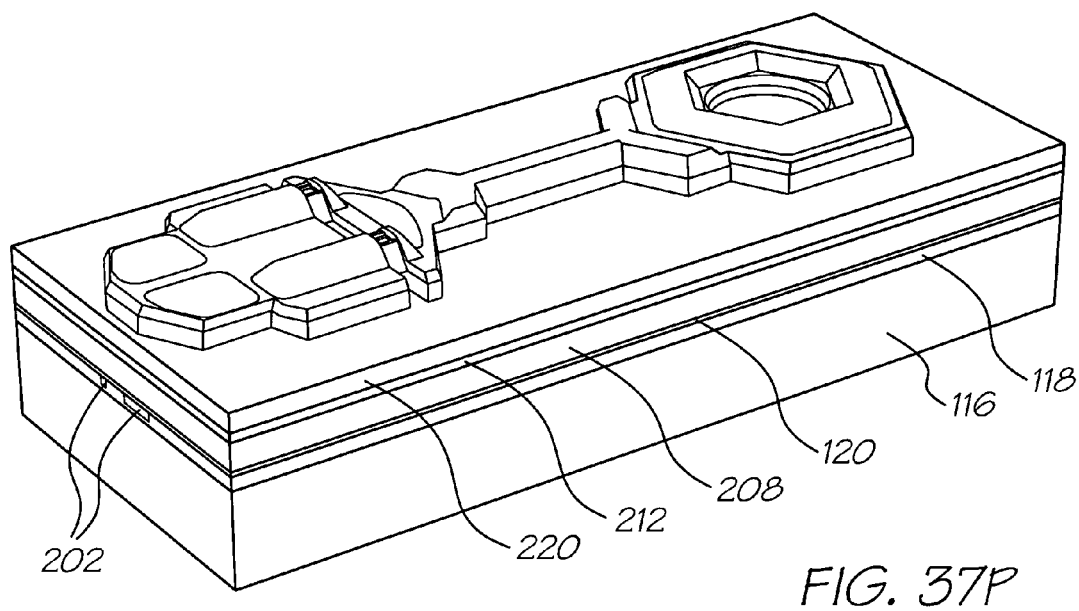
Figure 38P:
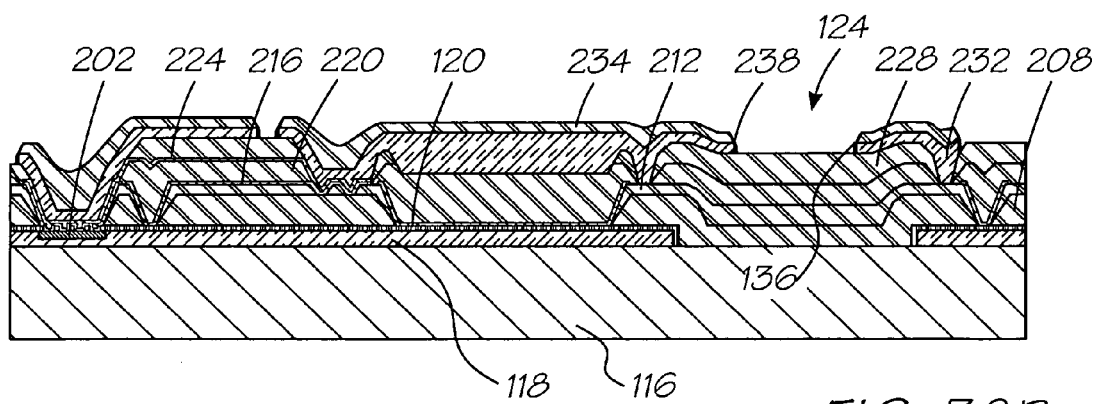
Figure 37Q:
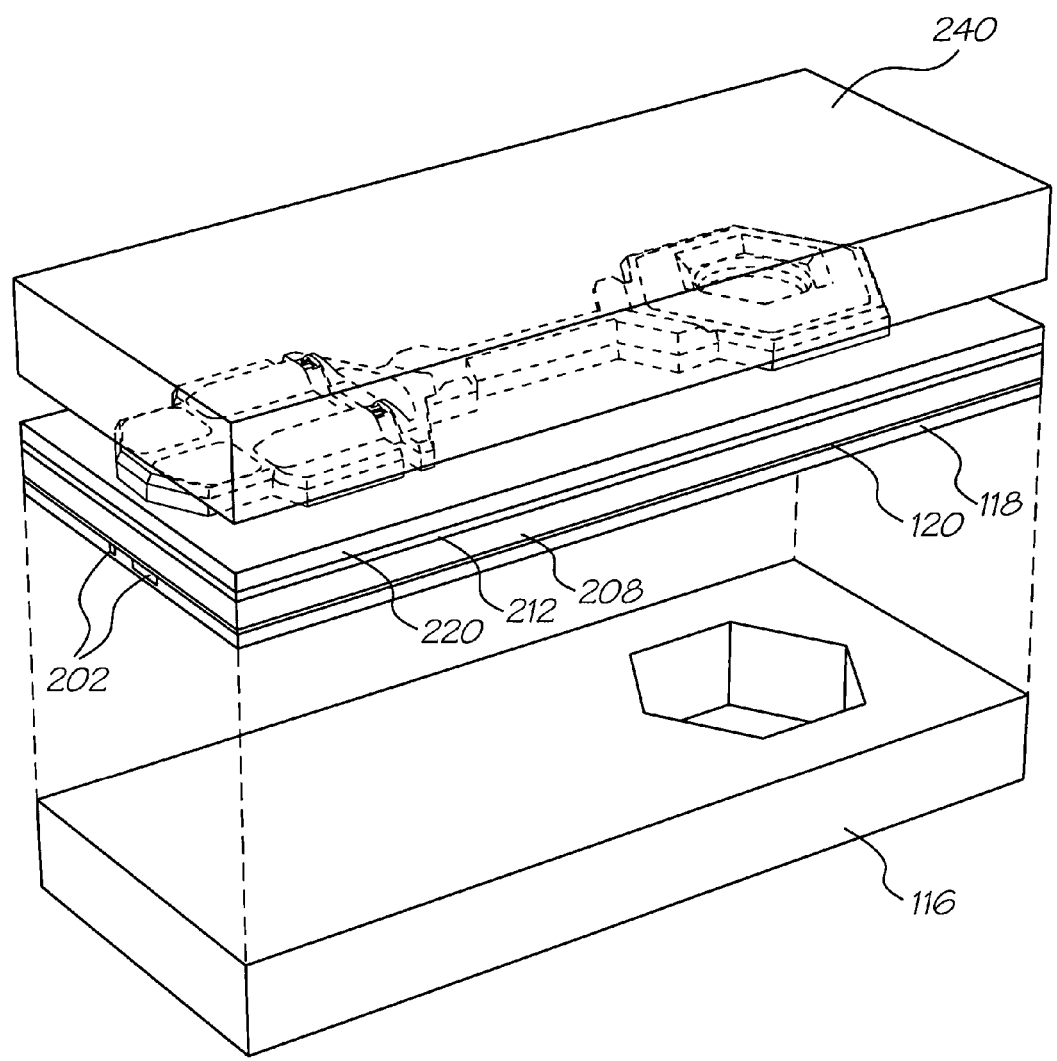

Then, as shown in FIG. 37p of the drawings, the layer 238 is anisotropically plasma etched to a depth of 0.35 microns. This etch is intended to clear the dielectric from the entire surface except the side walls of the dielectric layer 232 and the sacrificial layer 234. This step creates the nozzle rim 136 around the nozzle opening 124 which "pins" the meniscus of ink, as described above.

An ultraviolet (UV) release tape 240 is applied. 4 µm of resist is spun on to a rear of the silicon wafer 116. The wafer 116 is exposed to mask 242 to back etch the wafer 116 to define the ink inlet channel 148. The resist is then stripped from the wafer 116.

Figure 37R:
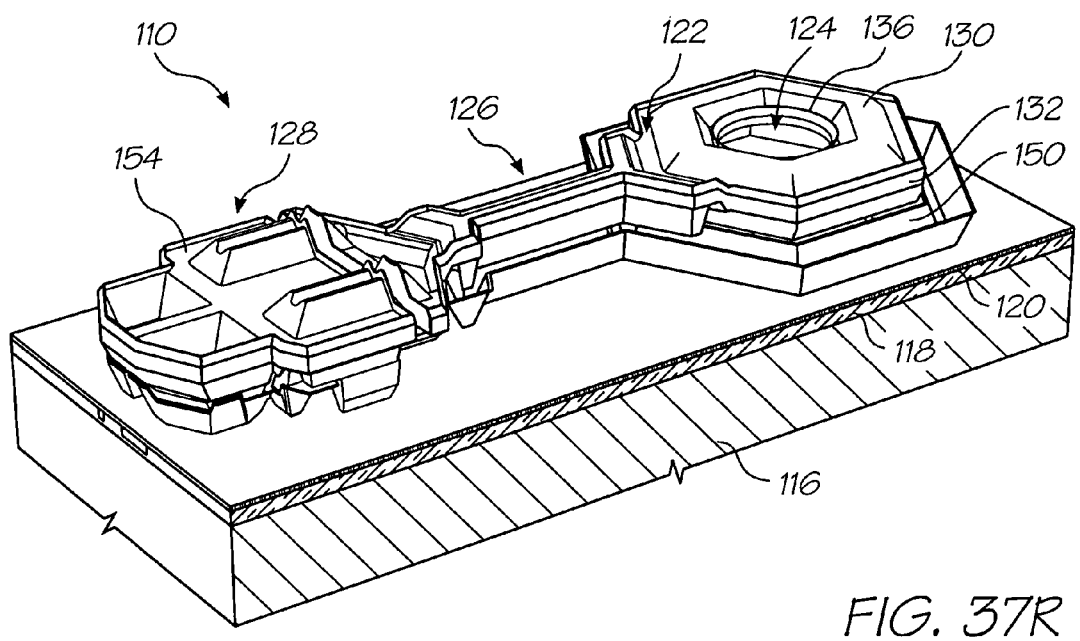
Figure 38R:
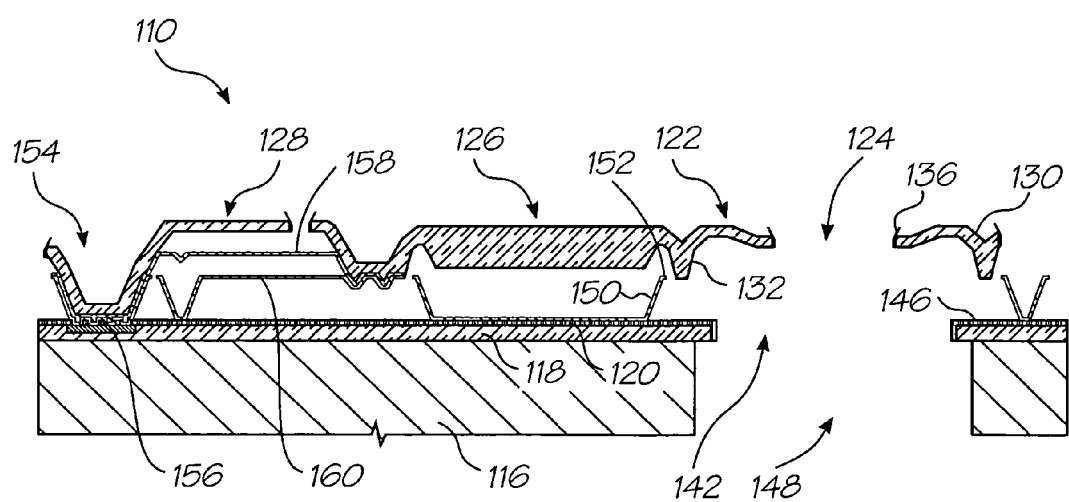
Figure 38Q:
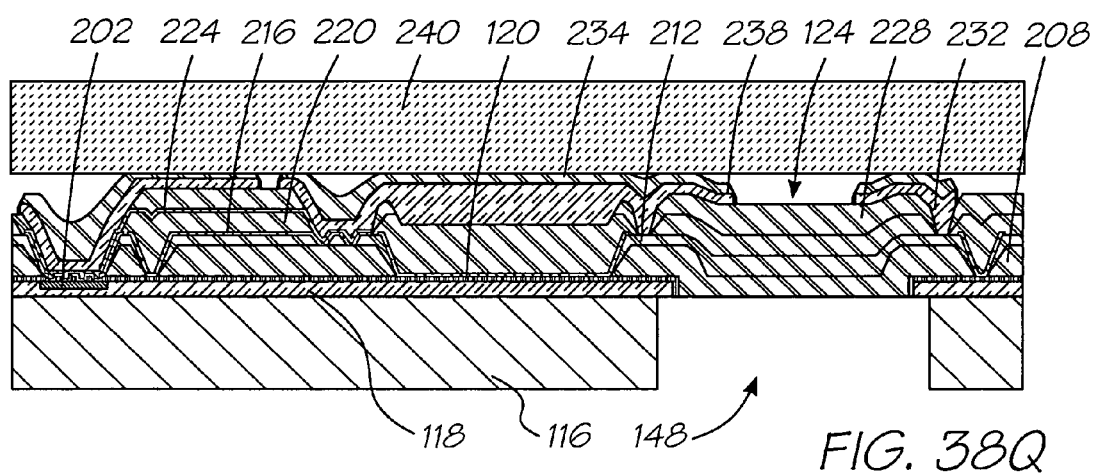
Figure 39K:
Figure 40A:
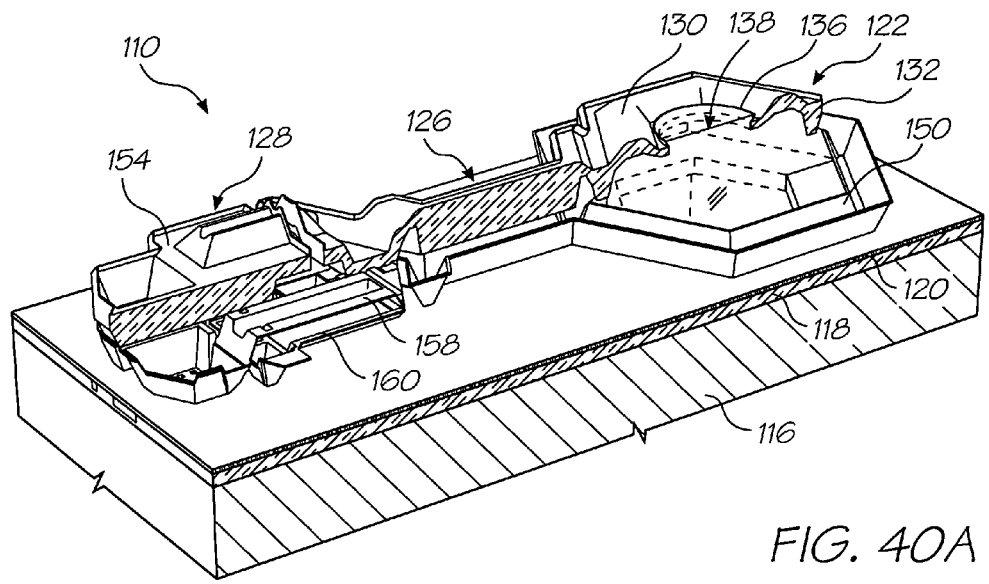
FIGS. 40a to 40c show three dimensional views of an operation of the nozzle assembly manufactured according to the method of FIGS. 37 and 38.
Figure 41A:
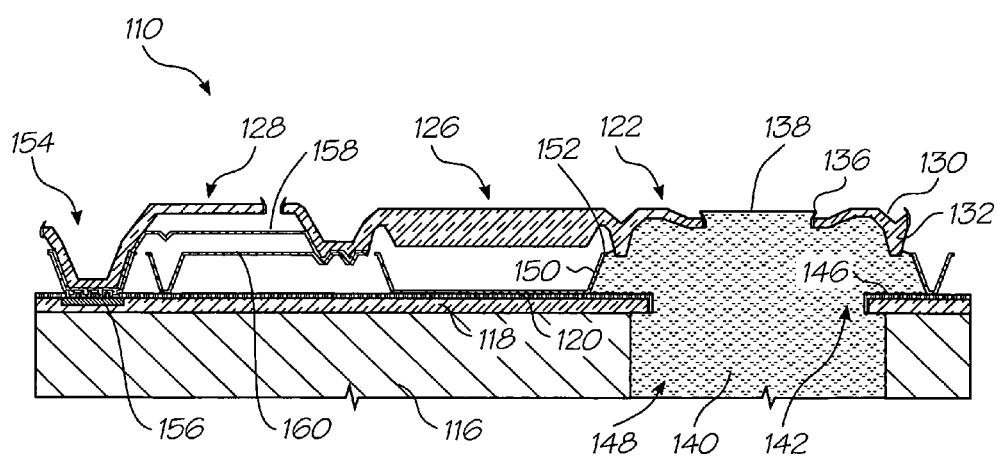
FIGS. 41a to 41c show sectional side views of an operation of the nozzle assembly manufactured according to the method of FIGS. 37 and 38.
Figure 40B:
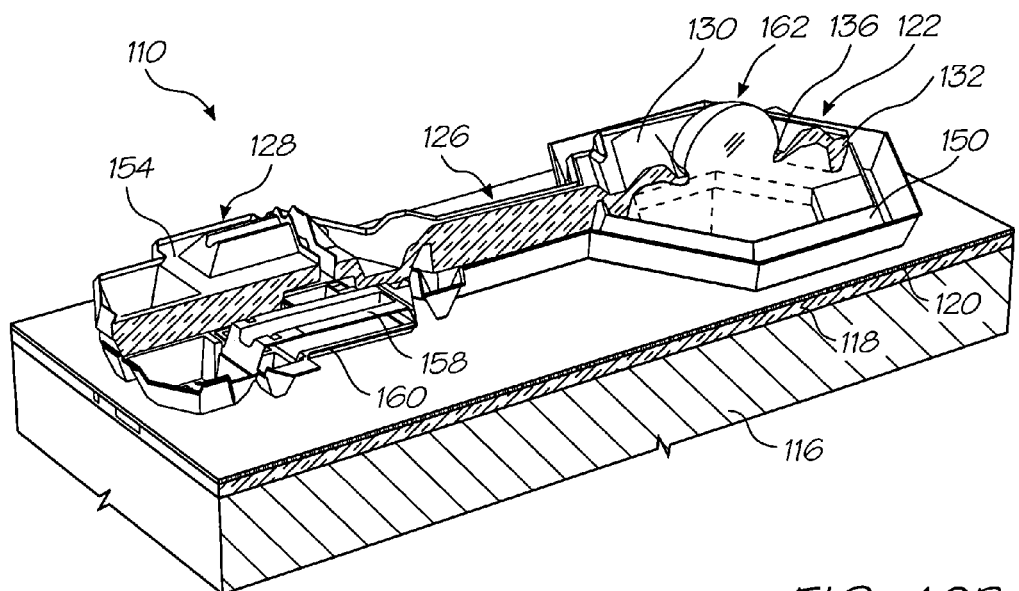
Figure 41B:
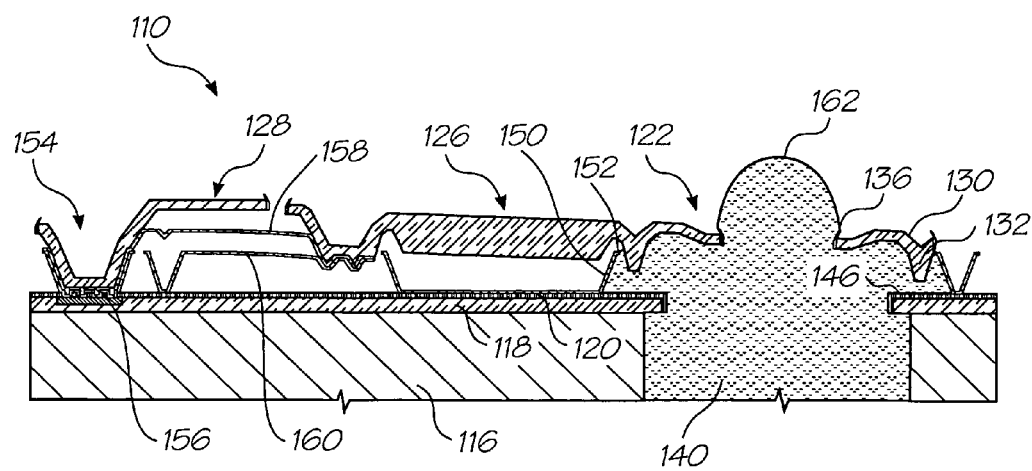
Figure 40C:
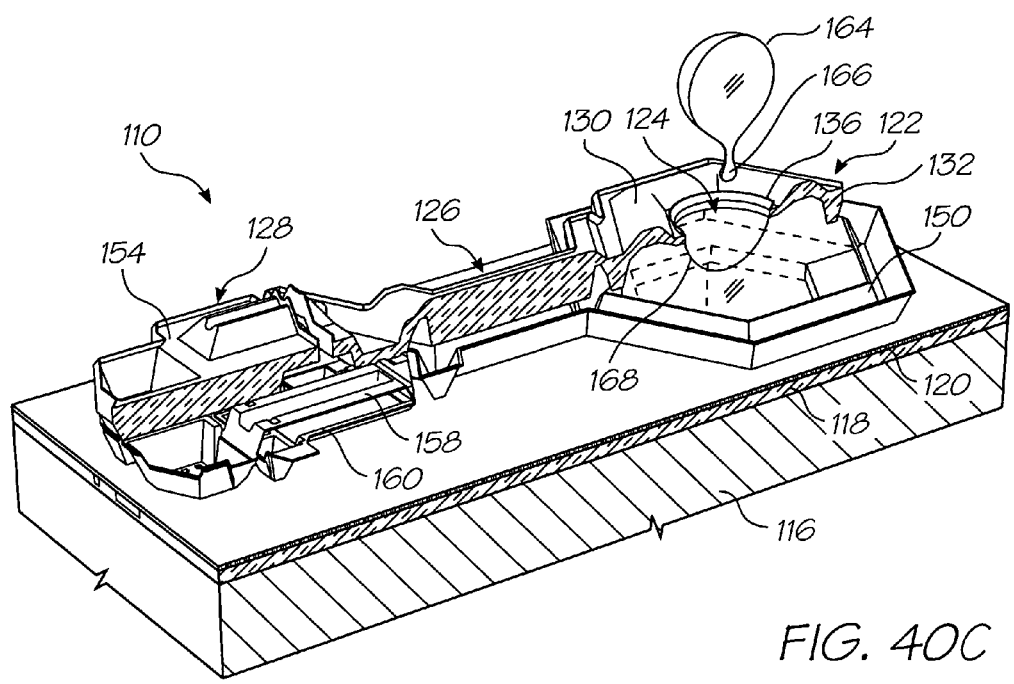
Figure 41C:
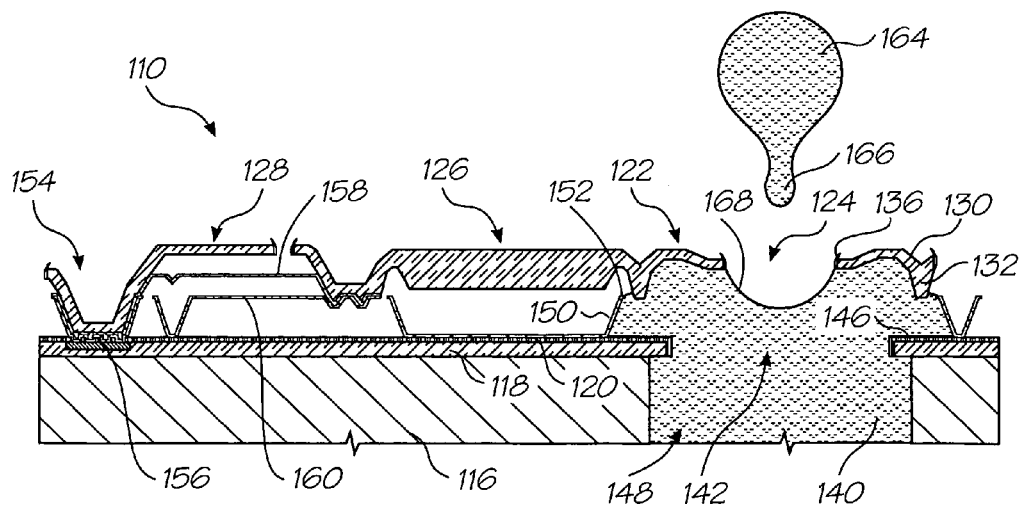

A further UV release tape (not shown) is applied to a rear of the wafer 16 and the tape 240 is removed. The sacrificial layers 208, 212, 220, 228 and 234 are stripped in oxygen plasma to provide the final nozzle assembly 110 as shown in FIGS. 37r and 38r of the drawings. For ease of reference, the reference numerals illustrated in these two drawings are the same as those in FIG. 30 of the drawings to indicate the relevant parts of the nozzle assembly 110. FIGS. 40 and 41 show the operation of the nozzle assembly 110, manufactured in accordance with the process described above with reference to FIGS. 37 and 38, and these figures correspond to FIGS. 31 to 34 of the drawings.

It would be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

We claim:

1. A micro-electromechanical ink ejection device for a printer, the device comprising:
   a wafer substrate defining an ink inlet channel and incorporating drive circuitry;
   a nozzle chamber structure positioned on the wafer substrate and including a wall that defines a slot extending away from the substrate and a roof that defines a part-circumferential opening into the slot, the nozzle chamber structure defining a nozzle chamber in fluid communication with the ink inlet channel and an ink ejection port through which ink in the nozzle chamber can be ejected;

an ink ejection paddle positioned in the nozzle chamber and displaceable towards and away from the ink ejection port to eject ink from the ink ejection port;

a support extending from the wafer substrate outside the nozzle chamber; and an elongate actuator extending between the support and the paddle, a heater disposed at the support end of the actuator being connected to the drive circuitry to cause displacement of the paddle end of the actuator on receipt of a signal from the drive circuitry, the actuator being shaped to correspond with the slot and the part circumferential opening.

2. An ink ejection device as claimed in claim 1, wherein the ink chamber and ink inlet channel have a substantially equivalent cross sectional area.

3. An ink ejection device as claimed in claim 1, in which the heater is positioned so that the actuator undergoes thermal differential expansion and contraction to move the paddle.

4. An ink ejection device as claimed in claim 3, wherein the heater comprises an anchor which is contained within the support and the wafer substrate to be connected to the drive circuitry, and a heating element which extends from the support.

5. An ink ejection device as claimed in claim 4, wherein the actuator includes a body portion of a structural material and the heating element is located between the body portion and the wafer substrate.

6. An ink ejection device as claimed in claim 5, wherein the heating element is formed from copper nickel alloy.

7. An ink ejection device as claimed in claim 1, wherein the paddle defines a recess which faces toward the ink ejection port.

* * * * *